(12) United States Patent
Hasnain et al.

(10) Patent No.: US 12,464,884 B1
(45) Date of Patent: *Nov. 4, 2025

(54) LEAD-FREE PEROVSKITE SOLAR CELL WITH MULTILAYER FRAMED ASSEMBLY

(71) Applicant: PRINCE MOHAMMAD BIN FAHD UNIVERSITY, Dhahran (SA)

(72) Inventors: Syed M. Hasnain, Brisbane (AU); M. Amin Mir, Srinagar (IN)

(73) Assignee: PRINCE MOHAMMAD BIN FAHD UNIVERSITY, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 19/206,985

(22) Filed: May 13, 2025

(51) Int. Cl.
  *H10K 30/88* (2023.01)
  *H10K 30/40* (2023.01)

(52) U.S. Cl.
  CPC ............. *H10K 30/88* (2023.02); *H10K 30/40* (2023.02)

(58) Field of Classification Search
  CPC ........ H10K 30/40; H10K 30/84; H10K 30/57; H10K 30/88
  See application file for complete search history.

(56) References Cited

U.S. PATENT DOCUMENTS

| 2017/0271822 A1 | 9/2017 | Chaudhari |
| 2018/0366539 A1 | 12/2018 | Engen et al. |
| 2020/0035418 A1 | 1/2020 | Huang et al. |
| 2021/0082634 A1* | 3/2021 | Lee .......................... H10F 10/19 |
| 2021/0233717 A1 | 7/2021 | Lunt |

FOREIGN PATENT DOCUMENTS

| CN | 117396006 A | | 1/2024 |
| IN | 202311051470 A | * | 12/2023 |

OTHER PUBLICATIONS

Bhattarai (Performance Improvement of Perovskite Solar Cell Design with Double Active Layer to Achieve an Efficiency of over 31%), Sustainability 2023, 15, 13955, Sep. 2023, pp. 1-13 (Year: 2023).*

(Continued)

*Primary Examiner* — Devina Pillay
(74) *Attorney, Agent, or Firm* — Oblon, McClelland, Maier & Neustadt, L.L.P.

(57) ABSTRACT

A lead-free solar cell module having a top protective layer, a middle photoactive layer, a bottom protective later and a frame with the top protective layer, middle photoactive layer and the bottom protective layer secured in the frame. The middle photoactive layer includes a back metal contact layer including gold (Au), a hole transport layer (HTL) including copper oxide ($Cu_2O$), an inorganic absorber layer including rubidium germanium iodide ($RbGeI_3$), a perovskite absorber layer including methylammonium tin iodide ($MASnI_3$), an electron transport layer (ETL) including fullerene ($C_{60}$), and a front contact layer including indium tin oxide (ITO). The solar cell module achieves a current density ($J_{sc}$) of greater than or equal to 20 milliamperes per square centimeter ($mA/cm^2$) at an open-circuit voltage ($V_{OC}$) of 0.94 volts (V).

6 Claims, 30 Drawing Sheets

(56) References Cited

OTHER PUBLICATIONS

Hasnain (Novel dual absorber configuration for eco-friendly perovskite solar cells: design, numerical investigations and performance of ITO-C60-MASnI3-RbGeI3-Cu2O-Auâ), Solar Energy 278 (2024) 112788, pp. 1-9, Jul. 2024 (Year: 2024).*

Sarkar (A comprehensive study on RbGeI3 based inorganic perovskite solar cell using green synthesized CuCrO2 as hole conductor), Journal of Photochemistry & Photobiology, A: Chemistry 439 (2023) 114623, pp. 1-13, Feb. 2023 (Year: 2023).*

Nure Alam Sakib, et al., "Highly efficient (31%) of rubidium-based halide perovskite solar cell using SCAPS-1D simulation", AIP Advances, vol. 15, Issue 2, Feb. 2025, 025110, 20 Pages.

Sagar Bhattaraiet al., "Performance improvement of Perovskite solar cell design with double active layer to achieve an efficiency of over 31%", Sustainability 2023, vol. 15, Issue 18, 13955, 13 pages.

* cited by examiner

LEAD-FREE PEROVSKITE SOLAR CELL WITH MULTILAYER FRAMED ASSEMBLY

STATEMENT REGARDING PRIOR DISCLOSURE BY THE INVENTORS

Aspects of the present disclosure are described in Hasnain, S., et al., "Novel dual absorber configuration for eco-friendly perovskite solar cells: design, numerical investigations and performance of ITO-$C_{60}$-$MASnI_3$—$RbGeI_3$—$Cu_2O$—Au" published in Volume 278, Solar Energy, which is incorporated herein by reference in its entirety.

BACKGROUND

Technical Field

The present disclosure describes a method and system for solar energy capture and use for generating electricity, more particularly, a framed multilayer assembly that contains perovskite layer.

Description of Related Art

The "background" description provided herein presents the context of the disclosure generally. The work of the presently named inventors, to the extent it is described in this background section, as well as aspects of the description that may not otherwise qualify as prior art at the time of filing, are neither expressly nor impliedly admitted as prior art against the present disclosure.

Energy generation, energy storage, and the impact of global warming are serious issues in the modern world. The depletion of non-renewable resources and the rising carbon dioxide emissions have highlighted the urgent need for unconventional renewable energy technologies on a global scale. Solar energy, as an abundant and reliable resource, holds potential to meet future energy demands. This has made solar cell technology a major player in electrical power generation. Solar power has recently emerged as a viable alternative to conventional non-renewable energy sources. The sun's rays can be harnessed at any time and from any location on Earth. The environmental benefits of photovoltaic (PV) energy, which does not directly contribute to environmental harm or global warming, underscore its importance.

Over the past several decades, considerable research has been dedicated to improving the efficiency of semiconductor-based solar cells. Currently, silicon remains the material of choice for PV applications. Despite over 30 years of research aimed at enhancing the efficiency of these devices, widespread adoption has been limited due to the high cost of semiconducting materials and the quality of silicon required for solar applications. Consequently, researchers worldwide are exploring alternative materials. One promising avenue is the use of perovskite-structured materials. These materials, particularly organic-inorganic hybrid perovskites, have shown exceptional properties, including high absorption coefficients, ease of synthesis, customizable bandgaps, long diffusion lengths, and solution processability. These qualities make perovskites ideal candidates for use as active absorber materials in solar cells.

The first successful application of perovskites in solar cells was reported in 2009 by Kojima and researchers, with an initial efficiency of 3.8 percent (%) [Kojima, A., et al., Organometal halide perovskites as visible-light sensitizers for photovoltaic cells, *J Am Chem Soc.*, 2009,131, 17, 6050-1]. Over the past decade, the power conversion efficiency of perovskite solar cells has risen, reaching 25.5%. However, the presence of lead, a hazardous material, in many perovskite solar cells has become a major obstacle to their widespread commercialization. As a result, researchers have been exploring alternative divalent metal cations, such as $Sn^{2+}$ and $Ge^{2+}$, which are chemically similar to $Pb^{2+}$.

Substituting $Pb^{2+}$ with $Sn^{2+}$ in perovskite crystal structures has shown promise, as $Sn^{2+}$ has a smaller ionic radius than $Pb^{2+}$, which does not greatly alter the material's composition. Additionally, Sn-based perovskites, particularly methylammonium tin iodide ($MASnI_3$), exhibit narrower bandgaps, which theoretically make them more efficient than their Pb-based counterparts. It has a suitable narrow bandgap of 1.35 eV for perovskite solar cell applications and has shown good optoelectronic properties, with a predicted power conservation efficiency (PCE) of 21.24%. However, Sn-based perovskites are prone to oxidation under ambient conditions, leading to degradation and reduced efficiency. Furthermore, these materials exhibit self-doping and p-type metallic behavior due to the low formation energy of Sn+ vacancies, which also limits their performance.

Given its lower ionic radius (0.73 angstroms (Å)) in comparison to $Sn^{2+}$ and $Pb^{2+}$, $Ge^{2+}$ might be an alternative divalent metal cation to $Pb^{2+}$. Perovskites based on Ge have a better conductivity than perovskites based on Pb and Sn. Using SCAPS modeling, Raj and researchers showed that $CsGeI_3$ PSCs could achieve a maximum power conversion efficiency of 18.3% [Raj., A., et al., Evidence of improved power conversion efficiency in lead-free CsGeI3 based perovskite solar cell heterostructure via scaps simulation, *J. Vac. Sci. Technol. B,* 39, 012401, 2021]. In addition, they were able to get power conversion efficiency of 8.46% for the $SnO_2$ electron transport layer (ETL) and 8.45% for the fullerene ($C_{60}$) layer. Saikia and researchers [Saikia, D., et al., Performance evaluation of an all inorganic $CsGeI_3$ based perovskite solar cell by numerical simulation, *Optical Materials*, Volume 123, 2022, 111839] investigated $CsGeI_3$-based PSCs and their response to variations in thickness, defect concentration, and doping concentration. Researchers have looked at $CsGeI_3$ and $RbGeI_3$ as possible alternatives to lead-based perovskites in solar cells. Because $Ge^{2+}$ oxidation occurred during construction, Krishnamoorthy and researchers [Krishnamoorthy, T., et al., Lead-free germanium iodide perovskite materials for photovoltaic applications, *J. Mater. Chem. A,* 2015, 3, 23829-23832] were able to achieve a low power conversion efficiency of 0.11% when fabricating $CsGeI_3$-based PSCs. The optoelectronic, structural, thermoelectric, mechanical, and thermodynamic characteristics of $RbGeI_3$ perovskites were studied by Jayan and researchers for different exchange-correlation functionals. Perovskites made of cubic $RbGeI_3$ and $RbDyO_3$ were also investigated for their electrical, structural, and magnetic characteristics by Khursheed and researchers [Parrey, K. et al., First principle studies on structure, magneto-electronic and elastic properties of photovoltaic semiconductor halide ($RbGeI_3$) and ferromagnetic half metal oxide ($RbDyO_3$), *Computational Condensed Matter, Volume* 19, 2019, e00381]. In a first-principles study of these materials, calculations for multiple properties of $RbGeI_3$ perovskites was conducted using the PBE sol functional [Thiele, G., et al., Die Kristallstrukturen und phasentransformationen des tetramorphen $RbGeI_3$ *Z. anorg. allg. Chem.,* 571: 60-68, 1989]. These properties included the high-frequency dielectric constant ($\varepsilon_\infty$), static dielectric constant ($\varepsilon_0$), effective masses of electrons and holes ($m_e$, $m_h$), band gap, lattice constants, tolerance factor (0.90), and more. To examine the heating behavior of $RbGeI_3$, Theile and researchers also used X-ray diffraction and Raman spectroscopy. The $RbGeI_3$ as a perovskite material was simulated and demonstrated with a power conversion efficiency of 10.11%, fill factor (FF) of 63.68%, and QE of 90.3% in the visible range for toxicity-free renewable energy. The $FASnI_3$-absorber layer-based perovskite was studied by Alipour and researchers [Alipour, H., et al., Optimization of lead-free perovskite solar cells in normal-structure with $WO_3$ and water-free PEDOT: PSS composite for hole transport layer by SCAPS-1D simulation, *Optical Materials*, Volume 120, 2021, 111432; A., et al., Device modeling of high performance and eco-friendly FAMASnI3 based perovskite solar cell, *Sci Rep*, 14, 15427 2024]. They reported the current density ($J_{sc}$) of 24.65 milliamperes per square centimeter ($mA/cm^2$), open-circuit voltage ($V_{OC}$) of 1.12 volts (V), FF of 86.02%, and power conversion efficiency of 23.69%.

One area of concern in perovskite solar cell (PSC) research is the instability of organic materials used in the devices. Organic hole transport materials (HTMs), such as Spiro-OMeTAD, are commonly used in PSCs, but these materials are expensive and require complicated production processes, which can yield low efficiency. The synthesis procedure necessitates very low temperatures (195.15 kelvin (K)) and severe reagent conditions. Several coupling processes are included, including cyclization, bromination, Grignard, and Hartwig-Buchwald. Ahmad and researchers [Ahmad, O. et al., IModelling and numerical simulations of eco-friendly double absorber solar cell 'Spiro-OmeTAD/CIGS/MASnI3/CdS/ZnO' and its PV-module, *Organic Electronics*, Volume 117, 2023, 106781] reported the power conversion efficiency of 36.38% from a single cell with a performance ratio of 86.40% from there proposed double absorber solar cell.

Furthermore, expensive sublimation procedures are required to get Spiro-OMeTAD of high purity. Also, when exposed to light and environmental factors, organic charge transport materials (CTMs) degrade. Several inorganic CTMs, including NiO, $TiO_2$, $SnO_2$, $Cu_2O$, and $C_{60}$, have been investigated as potential substitutes for organic CTMs. In comparison to organic CTMs, inorganic CTMs have many advantages, such as a simpler manufacturing process, less cost, improved chemical and thermodynamic stability, a wider bandgap, more charge carrier mobility, and enhanced transparency to infrared, visible, and ultraviolet radiations.

Additionally, organic HTMs degrade when exposed to light and environmental factors. To address these challenges, researchers have explored inorganic HTMs, such as $Cu_2O$, which offer enhanced thermal and environmental stability, making them ideal candidates for use in solar cells. Inorganic HTMs like $Cu_2O$ provide excellent hole transport properties, chemical stability, and cost-effectiveness, all of which contribute to the improved longevity and performance of solar cells. $Cu_2O$ also has a wide bandgap, leading to minimal absorption of sunlight and maximizing light-harvesting efficiency. Similarly, inorganic electron transport materials (ETMs) like $C_{60}$ are highly effective in facilitating electron transport, preventing recombination, and enhancing solar cell efficiency. $C_{60}$'s high electron mobility, good chemical stability, and well-matched energy levels with perovskite absorber layers further support its use in solar cells.

In addition to individual improvements in HTMs and ETMs, research has shown that employing double active layers in solar cells can improve their performance. By combining different materials with complementary properties, double active layers enhance light absorption, charge separation, and reduce recombination losses, leading to higher power conversion efficiencies. The synergistic effects of these double active layers offer a promising route for optimizing the optical and electronic properties of solar cells, thereby improving their overall efficiency and stability.

Each of the aforementioned methods suffers from one or more drawbacks hindering their adoption. Accordingly, it is one object of the present disclosure to provide a solar cell that may circumvent aforementioned drawbacks to achieve improved efficiency, stability, and sustainability of PV devices.

SUMMARY

One aspect of the present disclosure includes a lead-free solar cell module that contains a top protective layer, a middle photoactive layer, a bottom protective later, and a frame such that all layers are secured in the frame. The middle photoactive layer includes a back metal contact layer including gold (Au), a hole transport layer (HTL) including copper oxide (Cu2O), an inorganic absorber layer including rubidium germanium iodide (RbGeI3), a perovskite absorber layer including methylammonium tin iodide (MASnI3), an electron transport layer (ETL) including fullerene (C60); and a front contact layer including indium tin oxide (ITO). The solar cell module achieves a current density ($J_{SC}$) of greater than or equal to 20 milliamperes per square centimeter (mA/cm2) at an open-circuit voltage (VOC) of 0.94 volts (V).

In some embodiments the frame surrounds a periphery of the top protective layer, middle photoactive layer and the bottom protective layer and the ETL has a thickness of 0.03 µm, the perovskite absorber layer has a thickness of 0.4 µm, the inorganic absorber layer has a thickness of 0.4 µm, the HTL has a thickness of 0.12 µm, and the solar cell has a Jsc of greater than or equal to 25 mA/cm2 at a VOC of 0.94 V.

In some embodiments the solar cell has a Jsc of greater than or equal to 30 mA/cm2 at a VOC of 0.94 V.

In some embodiments the solar cell has a power conservation efficiency (PCE) greater than or equal to 15 percent (%) based on the total power used at conditions of 32.7 mA/cm2 and a VOC of 0.94 V.

In some embodiments the solar cell has a PCE greater than or equal to 17.5% based on the total power used at conditions of 32.7 mA/cm2 and a VOC of 0.94 V.

In some embodiments the solar cell has a PCE greater than or equal to 20% based on the total power used at conditions of 32.7 mA/cm2 and a VOC of 0.94 V.

In some embodiments the ETL has a thickness in a range between 0.01 and 0.05 micrometer (µm).

In some embodiments the ETL has a thickness in a range between 0.02 and 0.04 µm.

In some embodiments the ETL has a thickness in a range between 0.025 and 0.035 µm.

In some embodiments the perovskite absorber layer has a thickness in a range between 0.2 and 0.6 µm.

In some embodiments the perovskite absorber layer has a thickness in a range between 0.3 and 0.5 µm.

In some embodiments the perovskite absorber layer has a thickness in a range between 0.35 and 0.45 µm.

In some embodiments the inorganic absorber layer has a thickness in a range between 0.2 and 0.6 µm.

In some embodiments the inorganic absorber layer has a thickness in a range between 0.3 and 0.5 µm.

In some embodiments the inorganic absorber layer has a thickness in a range between 0.35 and 0.45 µm.

In some embodiments the HTL has a thickness in a range between 0.02 and 0.22 μm.

In some embodiments the HTL has a thickness in a range between 0.07 and 0.17 μm.

In some embodiments the HTL has a thickness in a range between 0.10 and 0.14 μm.

In some embodiments the HTL has an energy bandgap in a range from 2.07 to 2.27 electron volts (eV) and the ETL has an energy bandgap in a range from 1.60 to 1.80 eV.

In some embodiments the inorganic absorber layer has an energy bandgap in a range from 1.21 to 1.41 eV and the perovskite absorber layer has an energy bandgap in a range from 1.2 to 1.4 eV. The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
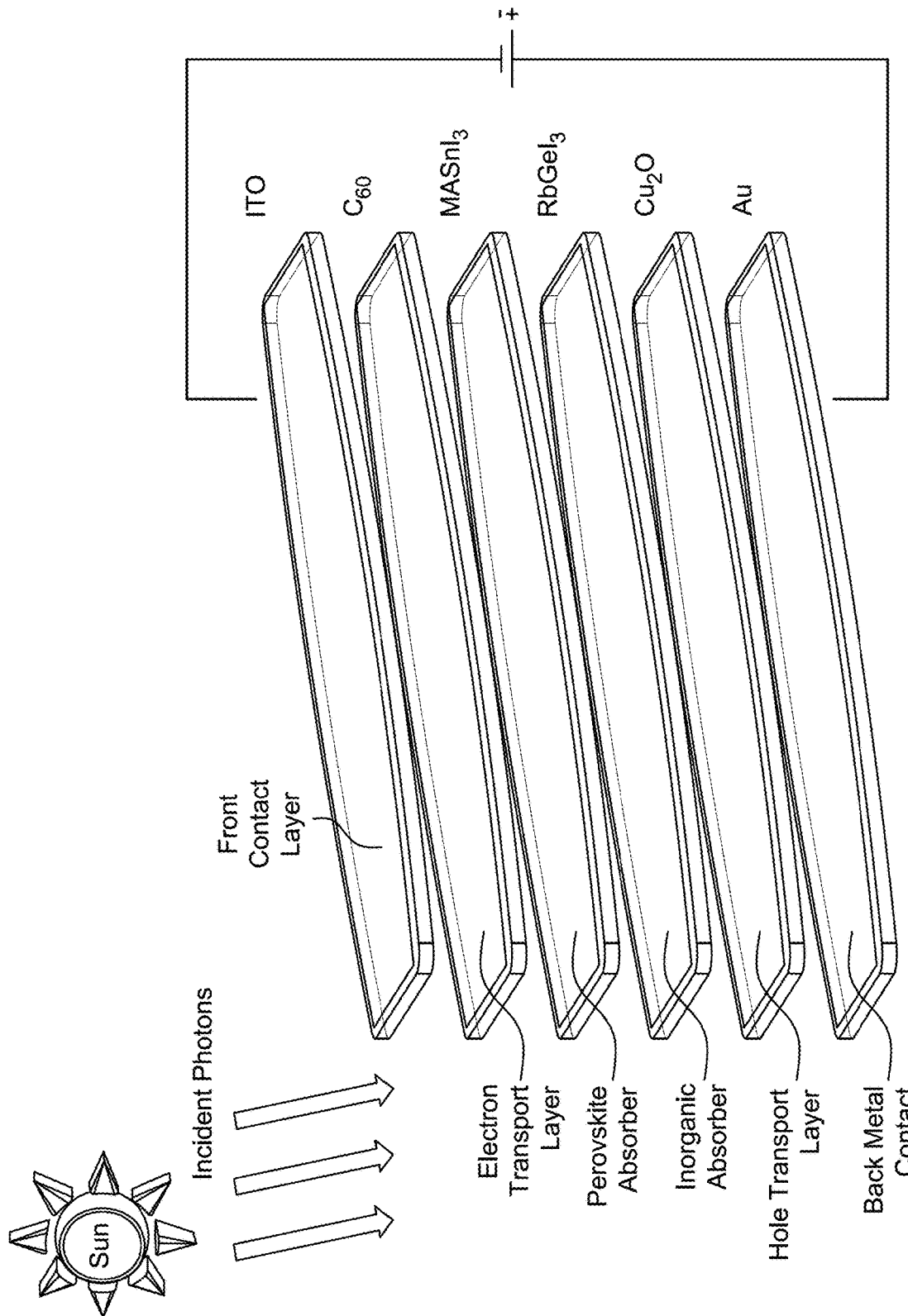
FIG. 1 is a schematic illustration of a simulated diagram of organo-inorganic perovskite solar cell, according to certain embodiments.

When describing the present disclosure, the terms used are to be construed in accordance with the following definitions, unless a context dictates otherwise.

Embodiments of the present disclosure will now be described more fully hereinafter with reference to the accompanying drawings wherever applicable, in that some, but not all, embodiments of the disclosure are shown.

In the drawings, like reference numerals designate identical or corresponding parts throughout the several views. Further, as used herein, the words 'a,' 'an' and the like generally carry a meaning of 'one or more,' unless stated otherwise.

Furthermore, the terms 'approximately,' 'approximate,' 'about,' and similar terms generally refer to ranges that include the identified value within a margin of 20 percent (%), 10%, or preferably 5%, and any values therebetween.

As used herein, the term 'room temperature' refers to a temperature range of '25 degrees Celsius (° C.)±3° C. in the present disclosure.

As used herein, the term 'current density ($J_{sc}$)' refers to the amount of current travelling per unit cross-section area.

As used herein, the term 'recombination current density' refers to the current generated in a semiconductor material due to the recombination of charge carriers (electrons and holes) within the device. This current is typically undesirable, as it reduces the efficiency of devices like solar cells by limiting the number of charge carriers available for energy production.

As used herein, the term 'solar cell' refers to a nonmechanical device that converts sunlight directly into electricity.

As used herein, the term 'lead-free solar cell' refers to a type of photovoltaic (PV) cell that does not contain lead as a semiconductor material, often utilizing alternative materials like tin or copper to reduce environmental and health risks associated with lead. These cells aim to provide sustainable and eco-friendly energy solutions.

As used herein, the term 'fill factor (FF)' refers to an electrical parameter of a solar cell that measures its performance and efficiency.

As used herein, the term 'power conservation efficiency (PCE)' refers to the measure of how effectively a system retains energy by minimizing losses during processes such as energy conversion, storage, or transmission.

As used herein, the term 'energy conversion rates' refers to the efficiency of converting energy from one form to another.

As used herein, the term 'back metal contact layer' refers to a conductive layer on the rear side of a solar cell or semiconductor device that facilitates the efficient collection and transport of electrons to the external circuit.

As used herein, the term 'hole transport layer (HTL)' refers to a layer in electronic devices, such as solar cells, that facilitates the movement of positive charge carriers (holes) from the active layer to the electrode. It plays a role in improving charge collection efficiency and reducing recombination losses.

As used herein, the term 'inorganic absorber layer' refers to a layer in solar cells or other optoelectronic devices made of inorganic materials, such as silicon or perovskite, that absorbs light and converts it into electrical energy. This layer helps determine the efficiency and performance of the device.

As used herein, the term 'perovskite absorber layer' refers to a layer in solar cells made from perovskite-structured materials, which efficiently absorb light and convert it into electricity. This layer is known for its high absorption efficiency, low production cost, and potential for use in next-generation PV devices.

As used herein, the term 'electron transport layer (ETL)' refers to a thin material layer in electronic devices, such as solar cells, that facilitates the movement of electrons from the active layer to the external circuit, enhancing efficiency. It helps minimize electron-hole recombination, improving overall device performance.

As used herein, the term 'front contact layer' refers to a conductive layer on the front surface of a solar cell or semiconductor device that collects and transports electrons generated by light absorption. It typically consists of transparent conductive materials to allow light to pass through while providing electrical conductivity.

As used herein, the term 'open-circuit voltage ($V_{OC}$)' refers to the maximum voltage a solar cell or electronic device can produce when it is not connected to an external load or circuit. It represents the potential difference between the positive and negative terminals when no current is flowing.

As used herein, the term 'quantum efficiency (QE)' refers to the ratio of the number of charge carriers generated to the number of incident photons absorbed by a material or device, indicating its efficiency in converting light into electrical energy.

The present disclosure is intended to include all hydration states of a given compound or formula, unless otherwise noted or when heating a material.

In addition, the present disclosure is intended to include all isotopes of atoms occurring in the present compounds and complexes. Isotopes include those atoms having the same atomic number but different mass numbers. By way of general example, and without limitation, isotopes of hydrogen include deuterium and tritium, and isotopes of carbon include $^{13}C$ and $^{14}C$. Isotopically-labeled compounds of the disclosure may generally be prepared by conventional techniques known to those skilled in the art or by processes analogous to those described herein, using an appropriate isotopically-labeled reagent in place of the non-labeled reagent otherwise employed.

Aspects of the present disclosure are directed toward a PV lead-free solar cell based on indium tin oxide-$C_{60}$-methylammonium tin iodide-rubidium germanium iodide-copper (I) oxide-gold (ITO-$C_{60}$-MASnI$_3$—RbGeI$_3$—Cu$_2$O—Au).

The solar cell includes a double absorber layer structure composed of stable, cost-effective inorganic materials. This design seeks to enhance the efficiency, stability, and environmental sustainability of solar cells while addressing challenges such as material degradation, high manufacturing costs, and the environmental impact of lead-based perovskites.

A lead-free solar cell is described. The lead-free solar cell includes, in the following order, a back metal contact layer including gold (Au), HTL including copper oxide ($Cu_2O$), an inorganic absorber layer including rubidium germanium iodide ($RbGeI_3$), a perovskite absorber layer including methylammonium tin iodide ($MASnI_3$), an ETL including fullerene ($C_{60}$), and a front contact layer including ITO.

The back metal contact layer plays a role in collecting the electrical charge. The choice of Au provides excellent electrical conductivity and long-term durability, as gold is highly resistant to oxidation and corrosion, making it ideal for stable electrical connections. The HTL facilitates the movement of positive charge carriers (holes) from the absorber layers towards the back contact. The HTL includes $Cu_2O$, which is a p-type semiconductor used for its favorable energy level alignment with the adjacent absorber layer.

The lead-free solar cell further includes an inorganic absorber layer including $RbGeI_3$ and a perovskite absorber layer including $MASnI_3$, which is responsible for absorbing light and generating charge carriers. The perovskite absorber layer is another component where light is converted into charge carriers. Here, $MASnI_3$ is used, offering the advantages of a lead-free, tin-based material that still achieves high performance. This material has excellent light absorption properties, making it ideal for efficient PV operation.

The ETL provides for the efficient movement of negative charge carriers (electrons) from the absorber layer to the front contact. $C_{60}$ is used here due to its high electron mobility, which aids in the swift transport of electrons, improving the overall efficiency of the solar cell.

In one or more embodiments, the front contact layer includes ITO. ITO offers several benefits in solar cells, including high optical transparency, which allows maximum sunlight to penetrate for efficient energy conversion, and excellent electrical conductivity, which facilitates effective charge carrier collection while minimizing resistive losses. ITO is chemically stable and oxidation resistant, making it suitable for long-term use in a variety of environments.

The middle photoactive layer is covered by a top protective layer and a bottom protective layer. The protective layers function to provide a physical barrier to the middle photo active layer and resist or prevent the ingress of moisture and to avoid physical contact between the layers of the middle photoactive layer and other objects. The top protective layer is preferably a transparent thermoplastic material such as a polyethylene terephthalate. Other materials can be used such as ceramics. Glass may also be used as the top protective layer. The top protective layer is typically the uppermost and outer facing surface but nonetheless permits exposure of the middle photoactive layer to direct sunlight.

The bottom protective layer is preferably glass, metal or composite fiberglass material. The bottom protective layer provides support for the solar cell module and prevents ingress of moisture or atmosphere contaminants.

The frame preferably surrounds the periphery of the top, middle and bottom layers. The frame serves to hold the active layers together and provides a seal around the edges of each layer.

In some embodiments, the solar cell achieves a $J_{sc}$ of greater than or equal to 15 milliamperes per square centimeter ($mA/cm^2$), preferably 20 $mA/cm^2$, preferably greater than or equal to 21 $mA/cm^2$, preferably greater than or equal to 22 $mA/cm^2$, preferably greater than or equal to 23 $mA/cm^2$, preferably greater than or equal to 24 $mA/cm^2$, preferably greater than or equal to 25 $mA/cm^2$, preferably greater than or equal to 26 $mA/cm^2$, preferably greater than or equal to 27 $mA/cm^2$, preferably greater than or equal to 28 $mA/cm^2$, preferably greater than or equal to 29 $mA/cm^2$, preferably greater than or equal to 30 $mA/cm^2$, preferably greater than or equal to 31 $mA/cm^2$, preferably greater than or equal to 32 $mA/cm^2$ at a $V_{OC}$ of 0.94 volts (V). In a preferred embodiment, the solar cell has a $J_{sc}$ of 32.7 $mA/cm^2$.

In some embodiments, the solar cell has a PCE greater than or equal to 10 percent (%), preferably 15%, preferably greater than or equal to 15.5%, preferably greater than or equal to 16%, preferably greater than or equal to 16.5%, preferably greater than or equal to 17%, preferably greater than or equal to 17.5%, preferably greater than or equal to 18%, preferably greater than or equal to 18.5%, preferably greater than or equal to 19%, preferably greater than or equal to 19.5%, preferably greater than or equal to 20% based on the total power used at conditions of 32.7 $mA/cm^2$ and a $V_{OC}$ of 0.94 V.

In some embodiments, the ETL has a thickness in a range between 0.005-0.1 micrometer (m), preferably 0.01-0.05 μm, preferably 0.02-0.04 μm. In a preferred embodiment, the ETL has a thickness of 0.03 μm.

In some embodiments, the perovskite absorber layer has a thickness in a range between 0.1-0.8 μm, preferably 0.2-0.6 μm, preferably 0.3-0.5 μm. In a preferred embodiment, the perovskite absorber layer has a thickness of 0.4 μm.

In some embodiments, the inorganic absorber layer has a thickness in a range between 0.1-0.8 μm, preferably 0.2-0.6 μm, preferably 0.3-0.5 μm. In a preferred embodiment, the inorganic absorber layer has a thickness of 0.4 μm.

In some embodiments, the HTL has a thickness in a range between 0.005-0.35 μm, preferably 0.02-0.22 μm, preferably 0.03-0.21 μm, preferably 0.04-0.20 μm, preferably 0.05-0.19 μm, preferably 0.06-0.18 μm, preferably 0.07-0.17 μm, preferably 0.08-0.16 μm, preferably 0.09-0.15 μm, preferably 0.10-0.14 μm, and preferably 0.11-0.13 μm. In a preferred embodiment, the HTL has a thickness of 0.12 μm.

In some embodiments, the HTL has an energy bandgap in a range from 1.07-3.27 electron volts (eV), preferably 1.37-3.07, preferably 1.6-2.8, preferably 1.9-2.5 preferably 2.07-2.27 eV, and the ETL has an energy bandgap in a range from 0.60-2.80 eV, preferably 0.90-2.50 eV, preferably 1.2-2.1 eV, preferably 1.4-1.9 eV, preferably 1.60-1.80 eV.

In some embodiments, the inorganic absorber layer has an energy bandgap in a range from 0.21-2.41 eV, preferably 0.61-2.01 eV, preferably 0.81-1.81 eV, preferably 1.01-1.61 eV, preferably 1.21-1.41 eV, and the perovskite absorber layer has an energy bandgap in a range from 0.20-2.40 eV, preferably 0.6-2.0 eV, preferably 0.8-1.8 eV, preferably 1.0-1.6 eV, preferably 1.2-1.4 eV.

EXAMPLES

The following examples demonstrate a photovoltaic (PV) lead-free solar cell based on indium tin oxide-fullerene-methylammonium tin iodide-rubidium germanium iodide-copper(I) oxide-gold (ITO-$C_{60}$-$MASnI_3$—$RbGeI_3$—$Cu_2O$—Au). The examples are provided solely for illustration and are not to be construed as limitations of the present disclosure, as many variations thereof are possible without departing from the spirit and scope of the present disclosure.

Example 1: Proposed Design

A solar cell based on ITO-$C_{60}$-MASnI$_3$—RbGeI$_3$—Cu$_2$O—Au for achieving efficient performance in a simulated tandem solar cell is shown in FIG. 1, depicting a simulated diagram of organo-inorganic perovskite solar cell. The novel configuration of this setup involves the use of ITO as the first layer, which is exposed to light. The electron transport layer (ETL) is made of $C_{60}$, while the light-harvesting/absorber layers consist of MASnI$_3$ and RbGeI$_3$. Cu$_2$O is used as an HTL, and the back-contact layer is made of Au, as depicted in FIG. 1.

Several studies were conducted to determine the optimal values for the structural layers. Table 1 presents the material parameters for each layer. The parameters include the conduction band's density of states (CB-DOS), electron affinity ($\chi$), dielectric permittivity ($\varepsilon$), donor density ($N_d$), valence band's density of states (VB-DOS), band gap ($E_g$), electron mobility ($\mu_n$), hole mobility ($\mu_p$), and acceptor density ($N_a$). In order to verify the accuracy of the estimated values shown in Table 1 for simulation purposes, they were compared with many references from literature [Pindolia, G. et al., Optimization of an inorganic lead free RbGeI$_3$ based perovskite solar cell by SCAPS-1D simulation, *Solar Energy*, Volume 236, 2022, Pages 802-821; Singh, R. et al., Review of current progress in inorganic hole-transport materials for perovskite solar cells, *Applied Materials Today*, Volume 14, 2019, Pages 175-200; Samaki, S. et al., Materials and interfaces properties optimization for high-efficient and more stable RbGeI3 perovskite solar cells: optoelectrical modelling, *Scientific Reports*, volume 13, 15517, 2023; Bhattarai, S., et al., Investigation of carrier transport materials for performance assessment of lead-free perovskite solar cells, *IEEE Transactions on Electron Devices*, vol. 69, no. 6, pp. 3217-32242022; Patel, P., Device simulation of highly efficient eco-friendly CH3NH3SnI3 perovskite solar cell, *Scientific Reports*, volume 11, 3082, 2021; Wojciechowski, K. et al., C60 as an efficient n-type compact layer in perovskite solar cells, *J. Phys. Chem. Lett.*, 2015, 6, 12, 2399-2405; Sawicka-Chudy, P., et al., Numerical analysis and optimization of Cu2O/TiO2, CuO/TiO2, heterojunction solar cells using SCAPS, *J. Phys.: Conf Ser.*, 1033, 012002, 2018, each incorporated herein by reference in their entirety].

TABLE 1

Material parameters of HTL, absorber layers, and ETL layer.

| Materials parameters | Cu$_2$O layer | RbGeI$_3$ layer | MASnI$_3$ layer | C$_{60}$ layer |
|---|---|---|---|---|
| Thickness (μm) | 0.120 | 0.400 | 0.400 | 0.030 |
| Energy bandgap (electron volts (eV)) | 2.17 | 1.31 | 1.30 | 1.70 |
| Electron Affinity | 3.00 | 3.90 | 4.20 | 4.50 |
| Dielectric Permittivity | 7.50 | 23.01 | 8.20 | 10.00 |
| CB DOS | $2.00 \times 10^{18}$ | $1.40 \times 10^{19}$ | $1.00 \times 10^{18}$ | $2.20 \times 10^{18}$ |
| VB DOS | $1.10 \times 10^{1}$ | $2.80 \times 10^{19}$ | $1.00 \times 10^{18}$ | $1.80 \times 10^{19}$ |
| Electron/hole thermal velocity | $1.00 \times 10^{7}$ | $1.00 \times 10^{7}$ | $1.00 \times 10^{7}$ | $1.00 \times 10^{7}$ |
| Electron Mobility | $2.00 \times 10^{2}$ | $2.86 \times 10^{1}$ | 1.60 | $1.00 \times 10^{-1}$ |
| Hole Mobility | $8.00 \times 10^{1}$ | $2.73 \times 10^{1}$ | 1.60 | $1.00 \times 10^{-1}$ |
| $N_d$ | 0 | $1.00 \times 10^{9}$ | 0 | $1.00 \times 10^{16}$ |
| $N_a$ | $2.00 \times 10^{19}$ | $1.00 \times 10^{9}$ | $1.00 \times 10^{14}$ | 0 |

In order to identify a layer thickness the thickness of an individual layer was adjusted while keeping the thickness of the other layers unchanged. For the ideal layer thickness, find the highest and best values of the electrical parameters. Likewise, for every layer thickness, the batch parameters were adjusted. At first, several values between 0.01 micrometer (μm) and 0.40 μm were used to alter the ETL layer's thickness. The thickness of the $C_{60}$ layer was selected based on the maximum power conversion efficiency value. The thickness of the light-absorbing layers, namely MASnI$_3$ and RbGeI$_3$, was increased from 0.20 μm to 5 μm. The highest power conversion efficiency was recorded for each layer, corresponding to the thickness of the respective layers. The thickness of the Cu$_2$O layer, which acts as the HTL, was increased from 0.06 μm to 0.90 μm by keeping the thickness of all the layers above unchanged. At the ideal thickness of the HTL, the maximum power conversion efficiency was recorded.

Figure 2:
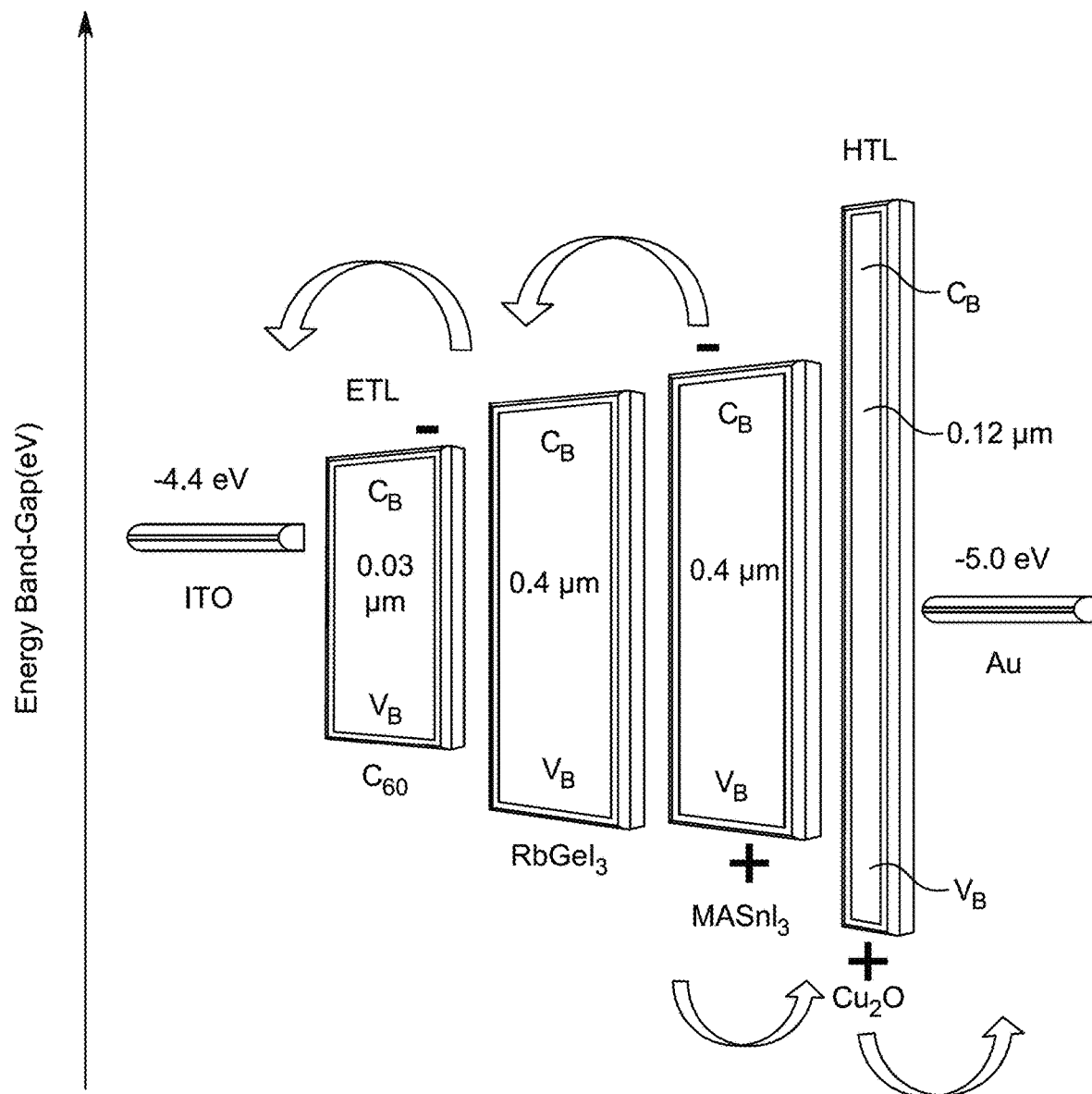
FIG. 2 is a schematic illustration of the energy band alignment of a design of proposed solar cells, according to certain embodiments.

The operational methodology of the solar cell capacitance simulator "SCAPS-1D" has been executed under established requirements. The data values were determined by following the stages in the prescribed systematic sequence. FIG. 2 displays the schematic diagram illustrating the suggested structure and energy band alignment of the design of the solar cell composition. The energy bands for both valence and conduction bands in all layers have been established by thorough analysis of legitimate experimental data, density functional theory (DFT), and other up-to-date literature sources. Table 2 lists material parameters of interfacial defects of layer [Pindolia, G. et al., Optimization of an inorganic lead free RbGeI$_3$ based perovskite solar cell by SCAPS-1D simulation, *Solar Energy*, Volume 236, 2022, Pages 802-821; Sarkar, D., et al., A comprehensive study on RbGeI3 based inorganic perovskite solar cell using green synthesized CuCrO2 as hole conductor, *Micromachines (Basel)*, 2023, 14, 8, 1562; Yao, Z., et al., Local temperature reduction induced crystallization of MASnI$_3$ and achieving a direct wafer production, *RSC Adv.*, 2017, 7, 38155-38159; Prabu, R. et al., Bandgap assessment of compositional variation for uncovering high-efficiency improved stable all-inorganic lead-free perovskite solar cells, *Phys. Status Solidi A*, 220, 2200791, 2023, each incorporated herein by reference in their entirety].

| Material parameters | Cu$_2$O/RbGeI$_3$ Interface defect | RbGeI$_3$/MASnI$_3$ Interface defect | MASnI$_3$/C$_{60}$ Interface defect |
|---|---|---|---|
| Defect type | Neutral | Neutral | Neutral |
| Capture cross-section for Electrons/Capture cross-section holes (cm$^2$) | $1 \times 10^{+20}$/ $1 \times 10^{+20}$ | $1 \times 10^{-20}$/ $1 \times 10^{-20}$ | $1 \times 10^{-20}$/ $1 \times 10^{-20}$ |
| Energy distribution | Single | Single | Single |
| E-level w.r.t $E_v$ (above $E_v$, $E_v$) | 0.6 | 0.6 | 0.6 |
| Total density (1/cm$^2$) | $1 \times 10^{10}$ | $1 \times 10^{10}$ | $1 \times 10^{12}$ |

Table 2. Material Parameters of Interfacial Defects of Layers.

Example 2: Device Modeling and Analysis

The University of Ghent's Department of Electronics and Information Systems (ELIS) created a solar cell capacitance simulator called SCAPS-1D version 3.3.008, which is employed for simulation purposes. Users have the option to use a maximum of seven structural levels when arranging solar cells inside this application. Its goal is to imitate the structure of layered solar cell groups, including CIGS and CdS, among others. Partially differential equations (PDEs), such as the semiconductor Poisson's equation (Eq. 1) and the electron and hole continuity equation, are utilized to build the computational code that this application uses.

$$-\nabla^2 \Psi = \frac{q}{\varepsilon s}[-p + n - N_d^+ + N_a^- \pm N_{def}] \quad (1)$$

The symbols $$N_d^+$$

and $$N_a^-$$

reflect the concentrations of donors and acceptors, respectively, p represents the hole density, n represents the electron density, q represents the elementary charge, and εs represents the permittivity. The symbol $N_{def}$ represents the defect density for the acceptor and donor concentrations, whereas $\Psi$ represents the electrostatic potential. The continuity equation that describes movement of charge carriers is shown in Eq. 2 and Eq. 3:

$$\nabla \cdot J_p + Up(n, p) = -G \quad (2)$$

And $$\nabla \cdot J_p + Up(n, p) = -G \quad (3)$$

Where, $J_p$ and $J_n$ indicates the holes current density ($J_{sc}$) and electrons $J_{sc}$, respectively. The rates at which holes and electrons recombine are represented by $U_p$ (n, p) and $U_n$ (n, p), respectively, whereas G represents the carrier production rate. The $J_{sc}$ of the charge carriers may be calculated using Eq. 4 and Eq. 5:

$$J_p = -qD_p\nabla_p + qn\mu_p E \quad (4)$$

$$J_n = qD_n\nabla_n + qn\mu_n E \quad (5)$$

In this context, q represents the charge, $\mu_p$, and $\mu_n$ refer to the mobilities of the charge carriers and $D_n$, $D_p$ represents the diffusion coefficients for the electrons and the holes, correspondingly. The calculations were performed using the $PV_{syst}$ software, that utilizes real-time coordinates of the geographical location, as well as climatic data from the mateonorm database. The mateonorm database is a well-recognized and internationally acknowledged source of solar radiation data.

Figure 3:
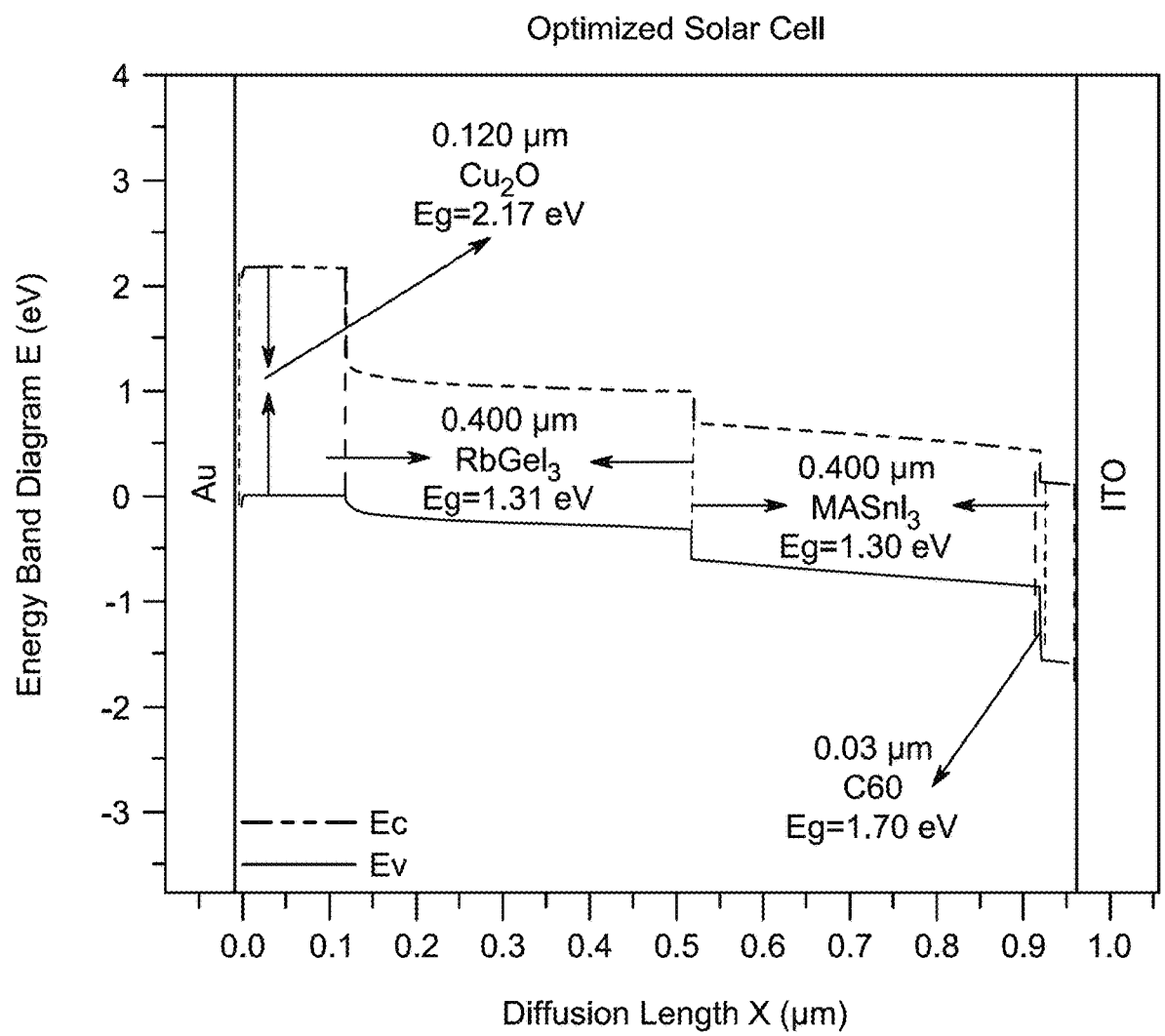
FIG. 3 is a schematic illustration of a device diagram of the energy band of dual absorber-based solar cells, according to certain embodiments.

FIG. 3 is a schematic illustration of the device diagram of the energy band of dual absorber-based solar cells. It displays the energy band profile of the dual absorber perovskite ITO-$C_{60}$-$MASnI_3$—$RbGeI_3$—$Cu_2O$—Au solar cell configuration. The absorber materials for the cells $MASnI_3$ and $RbGeI_3$, having bandgaps of 1.30 eV and 1.31 eV, yielded the refined energy gap values. The bandgap of "$C_{60}$" and "$Cu_2O$" were determined to be at 1.70 eV and 2.17 eV, respectively, for optimal device performance. For device performance, ITO with a work function and Gold/Rhodium "Au/Rh" metal contacts were implemented.

Figure 4:
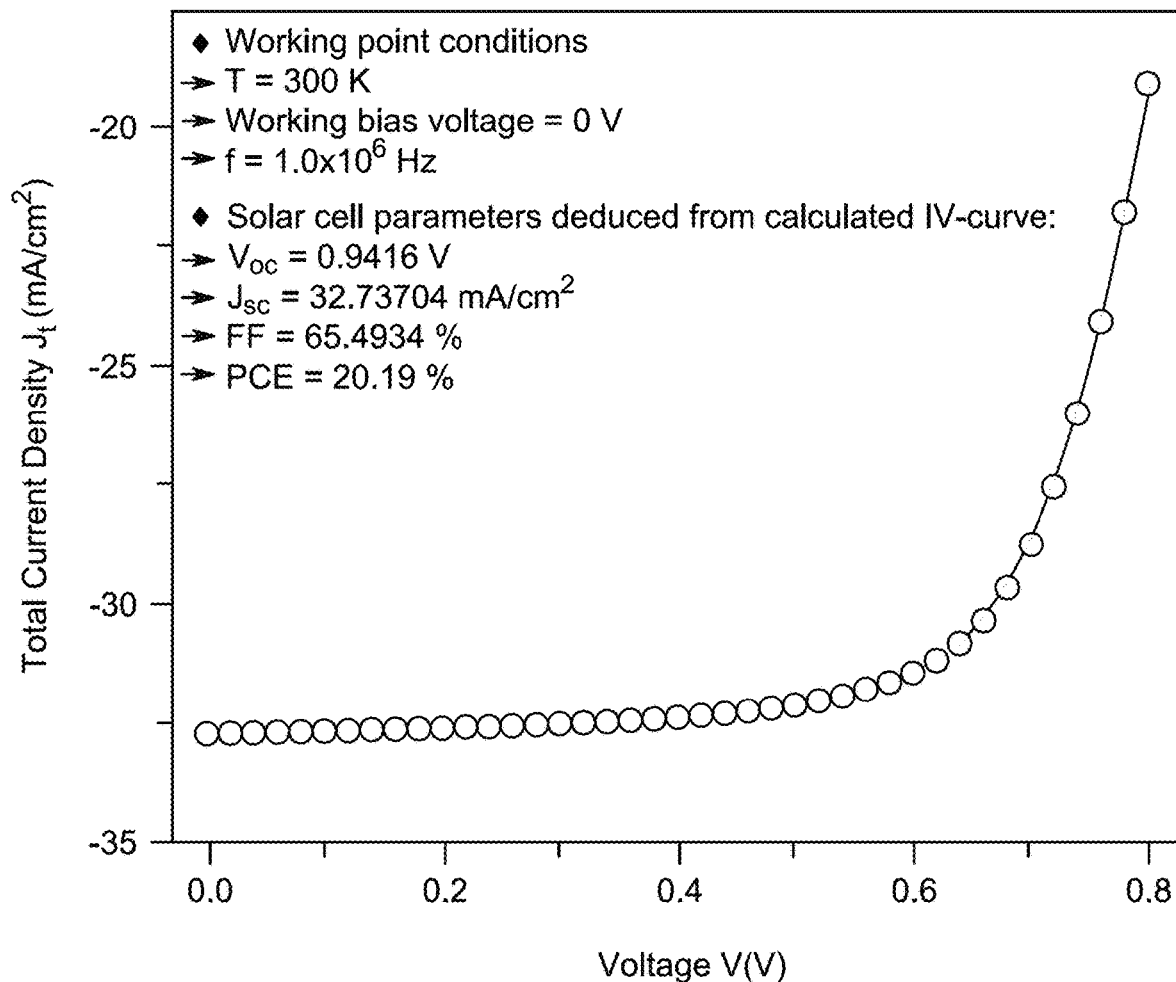
FIG. 4 is a plot showing current-voltage characteristics for the solar cell, according to certain embodiments.

Given the information shown in FIG. 4, it is evident that the performance of the solar cell is influenced by the specific conditions in which it is operated. The voltage-current density relationship, represented by "Jt," exhibits a rapid increase of around 0.7 volts (V) when different back contact layers are used in tandem solar cells, with the optimal structural layer thickness values. An inset of the suggested configuration's structural layer diagram has been included. The total $J_{sc}$ is 32.7 milliamperes per square centimeter (mA/cm$^2$) recorded at a "$V_{oc}$" of 0.94 V about the back-contact layer for the device configured optimally at a temperature of 300 kelvin (K). This also yields a power conservation efficiency (PCE) of 20.19% and an enhanced fill factor "FF" value of 65.49%.

Figure 5:
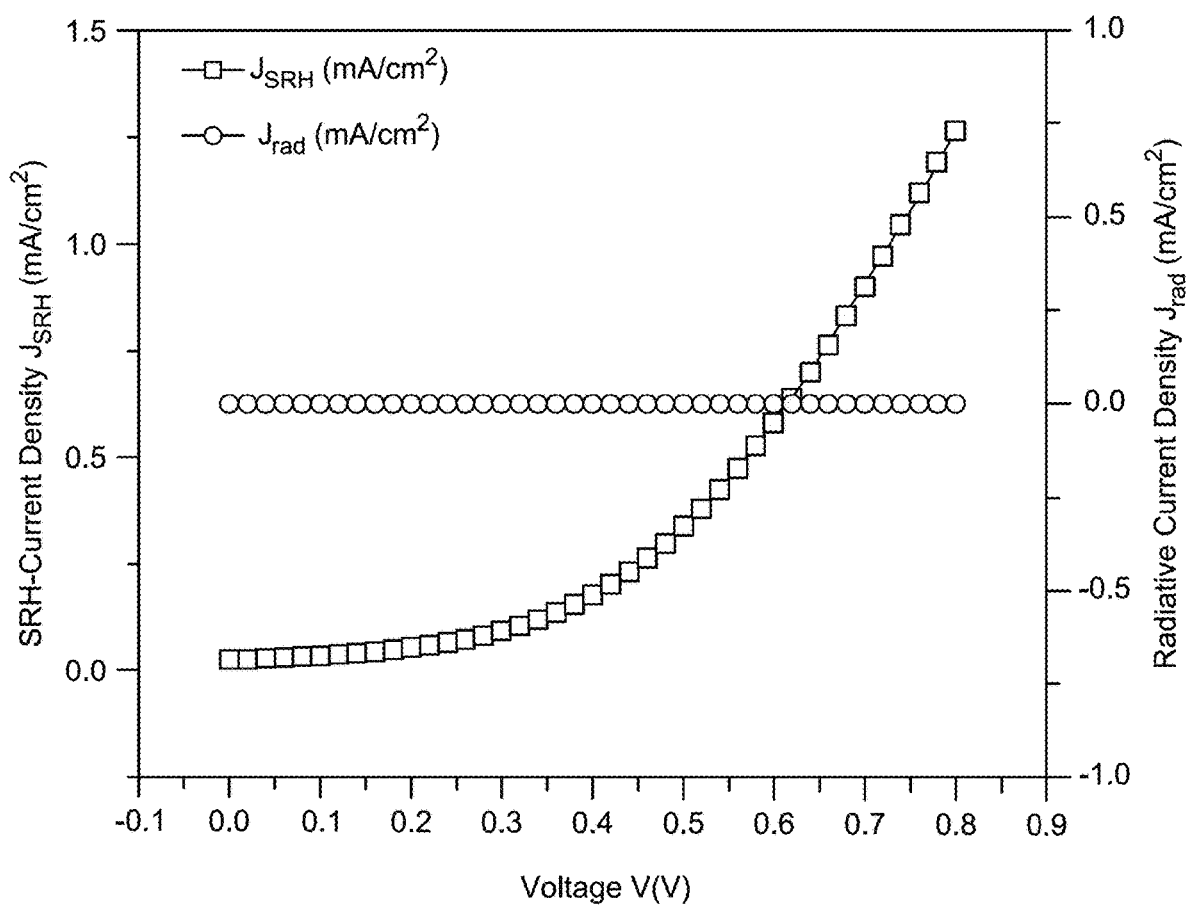
FIG. 5 is a plot showing Shockley-Read-Hall (SRH) current density ($J_{SRH}$)-voltage (V) characteristics for the solar cell, according to certain embodiments.

FIG. 5 depicts the relationship between the Shockley-Read-Hall (SRH) current density ($J_{SRH}$) and voltage of a solar cell with various contact layers. It also shows the recombination current density ($J_{recomb}$) of the carriers, which includes radiative, Auger, and trap-assisted recombination. The PV performance of the solar device might be affected by recombination processes that happen when the circuit voltage is approximately 0.7 V. For the recommended arrangement, the recombination process is inefficient, resulting in low recombination current densities which is a healthy sign for device performance.

Figure 6:
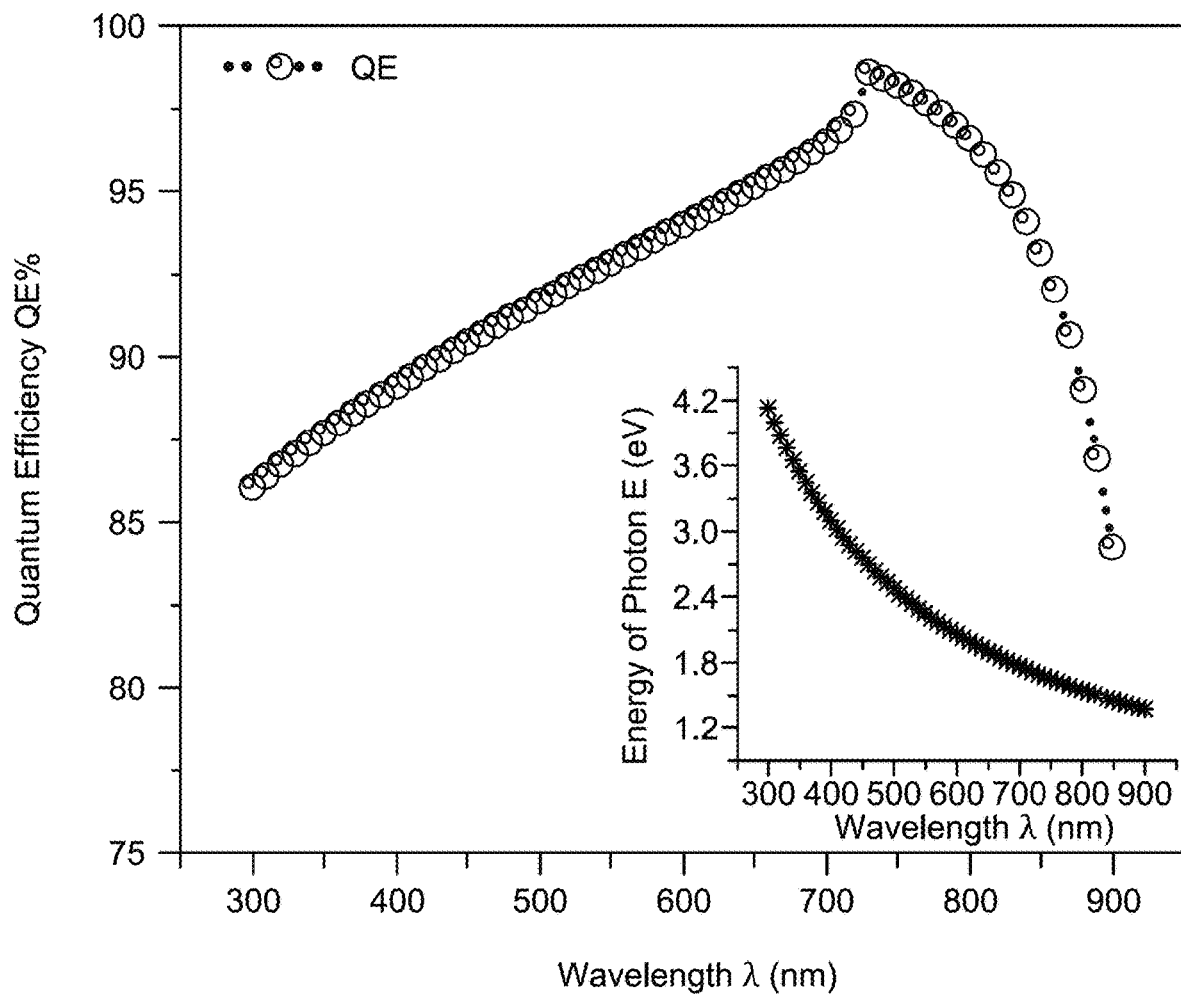
FIG. 6 is a plot for quantum Efficiency (QE %) as a function of wavelength for the proposed solar cell, according to certain embodiments.

A PV system's efficiency rises in direct proportion to its photon absorption throughout the visible, ultraviolet, and infrared portions of the electromagnetic spectrum. The photon absorption efficiency remains consistently over 86% in the ultraviolet (UV), visible, and infrared (IR) wavelengths, providing a favorable characteristic for PV systems. FIG. 6 illustrates the relationship between the quantum efficiency (QE %) and the wavelength of the spectrum for various back contact layers in an solar cell. In the solar spectrum, the 300 nanometers (nm) to 900 nm band have the highest light intensity. Optical maximum absorption mostly occurs within the visible light spectrum, with a lower presence in the infrared and ultraviolet areas. A higher quantum efficiency rating indicates greater absorption of incoming light. Continuing to raise the wavelength beyond 750 nm leads to a decline in efficiency, which becomes evident in the far-infrared area. Lower wavelengths of incoming radiations exhibit higher absorption, resulting in a decrease in device performance beyond these limitations.

Figure 7:
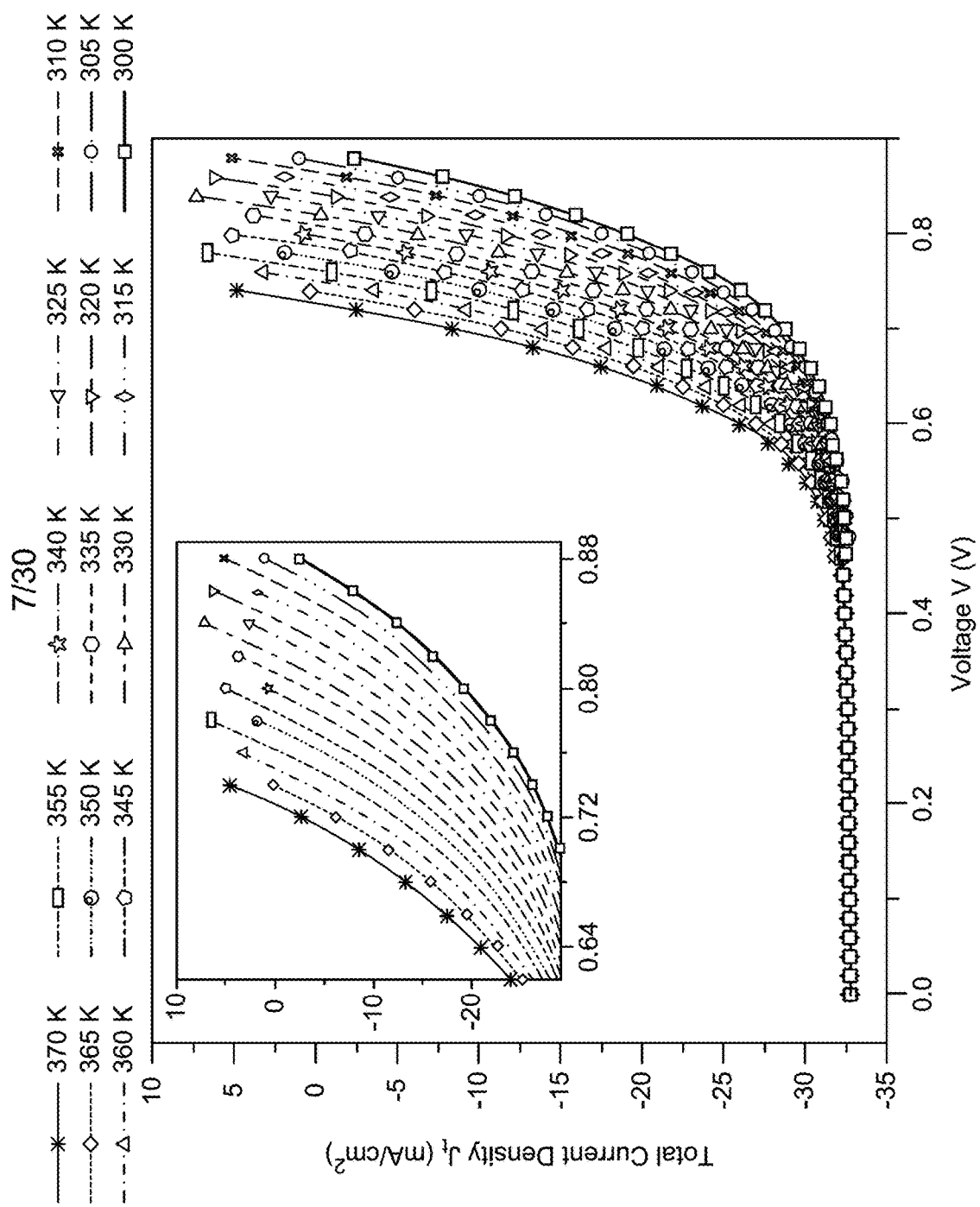
FIG. 7 is a plot for temperature dependent-current density-voltage (JV) characteristics of the solar cell, according to certain embodiments.

A PV device's efficiency grows in direct proportion to its photon absorption throughout the visible, ultraviolet, and infrared portions of the incoming electromagnetic spectrum. FIG. 6 shows the proposed device's quantum efficiency, and the inset provides the photon energy. PV devices benefit from the photon absorption efficiency, which is consistently over 86% throughout all visible, ultraviolet, and infrared wavelengths. The effectiveness of solar energy systems is highly temperature dependent. Thus, FIG. 7 depicts the assessment of the device's performance in relation to changes in temperature. A study was conducted to examine the variations in the JV curves from 300 K to 370 K. The inset depicts the area where there is a transition from lower to higher levels of current density. Temperature increase impacts the current density of the device, but only up to a certain limit. However, after the maximum value is reached, the current density begins to decline as a result of lattice vibrations and charge collisions.

Figure 8A:
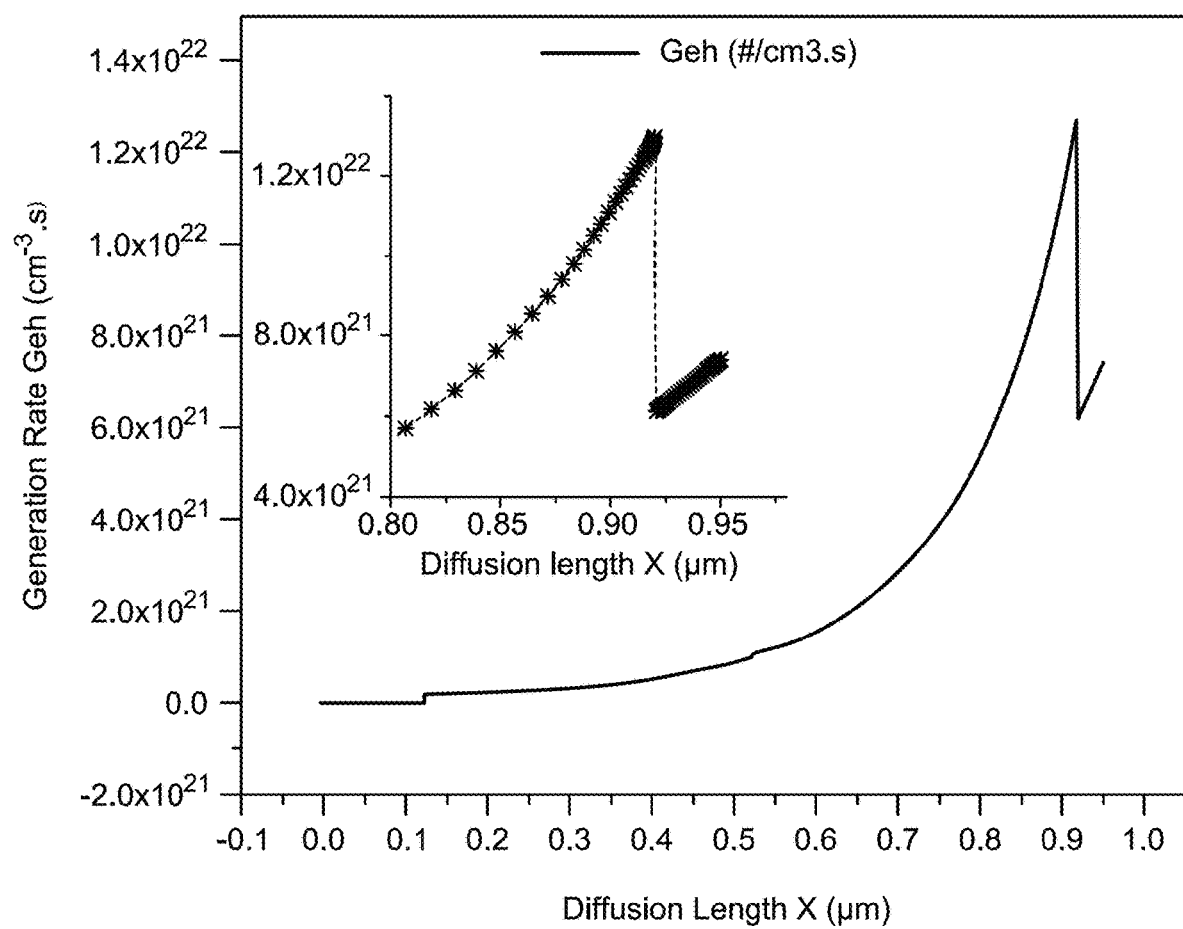
FIG. 8A is a plot for diffusion length versus generation of charge carriers of the solar cell, according to certain embodiments.
Figure 8B:
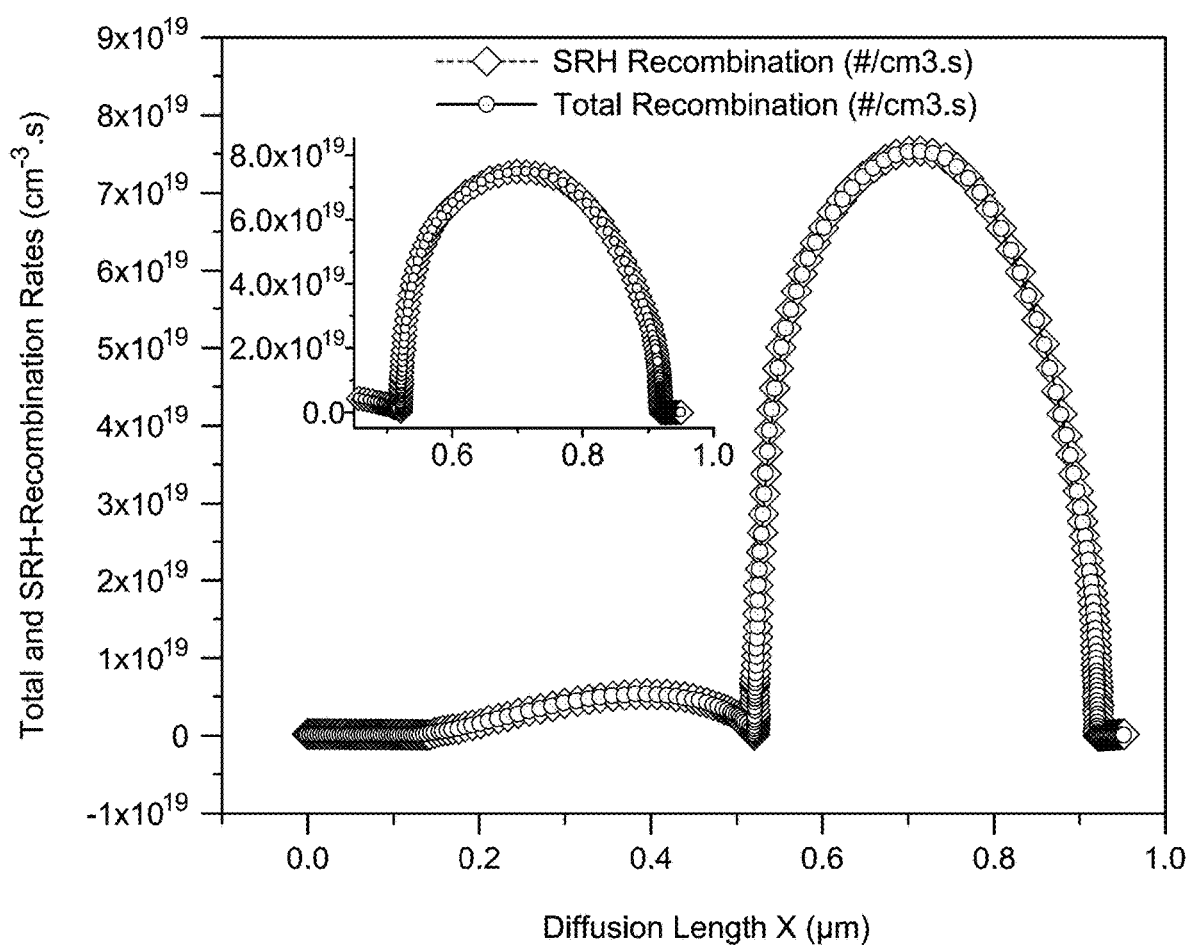
FIG. 8B is a plot for diffusion length versus total and SRH-recombination rates of the solar cell, according to certain embodiments.

The optimal performance of the solar cell model has been observed at temperatures higher than the average room temperature. FIG. 8A is a plot for diffusion length versus generation of charge carriers of the solar cell. The innovative cell design, consisting of ITO-$C_{60}$-$MASnI_3$—$RbGeI_3$—$Cu_2O$—Au, exhibits a substantial rise in the generation of charge carriers. The maximum rate of charge carrier production with a diffusion length of 0.92 μm has been found to be $1.3 \times 10^{22}$ second per cubic centimeter ($cm^{-3}s$). FIG. 8B is a plot for diffusion length versus total and SRH-recombination rates of the solar cell. As the carrier's production increases, there is also an observable increase in the recombination of carriers. The recombination mechanism is illustrated in FIG. 8B. The suggested design's rate of generation is lower than the maximum recorded charge carrier recombination rate of $7.5 \times 10^{19}$ $cm^{-3}/s$ at a surface depth of 0.73 μm. Consequently, the device's performance is enhanced as a result of the overall increase in carrier generation.

Figure 9:
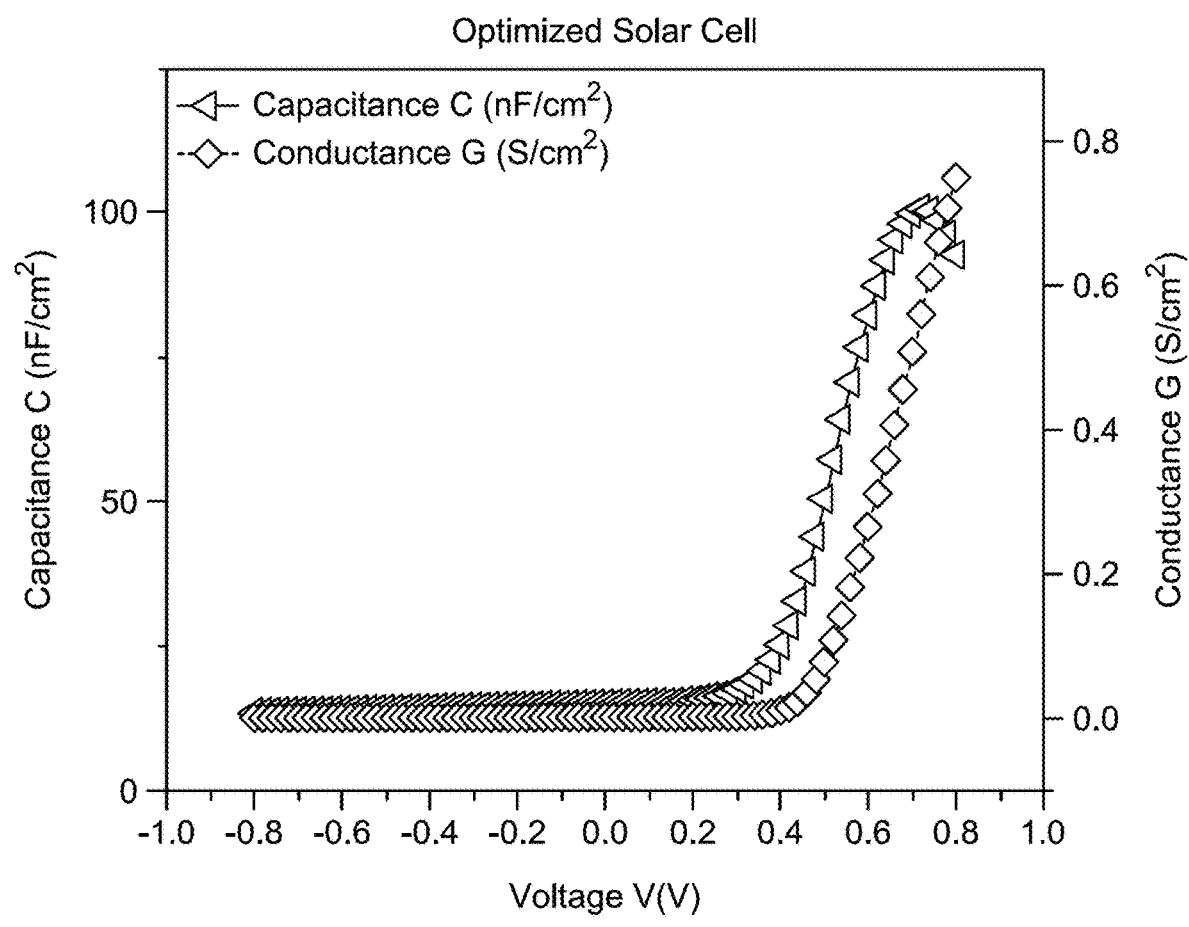
FIG. 9 is a plot showing effects of voltage on capacitance and conductance of solar cells based on double-absorbers, according to certain embodiments.

The device's durability and legitimacy can be verified by examining its conductivity and capacitance response in relation to the applied voltage, as depicted in FIG. 9. The device's performance would be enhanced in practical applications by increasing its charge storage capacity and conductivity. An observed value of 0.72 siemens per square centimeter ($S/cm^2$) for conductivity and 98 nanofarads per square centimeter ($nF/cm^2$) for capacitance has been found at around 0.8 V.

Figure 10:
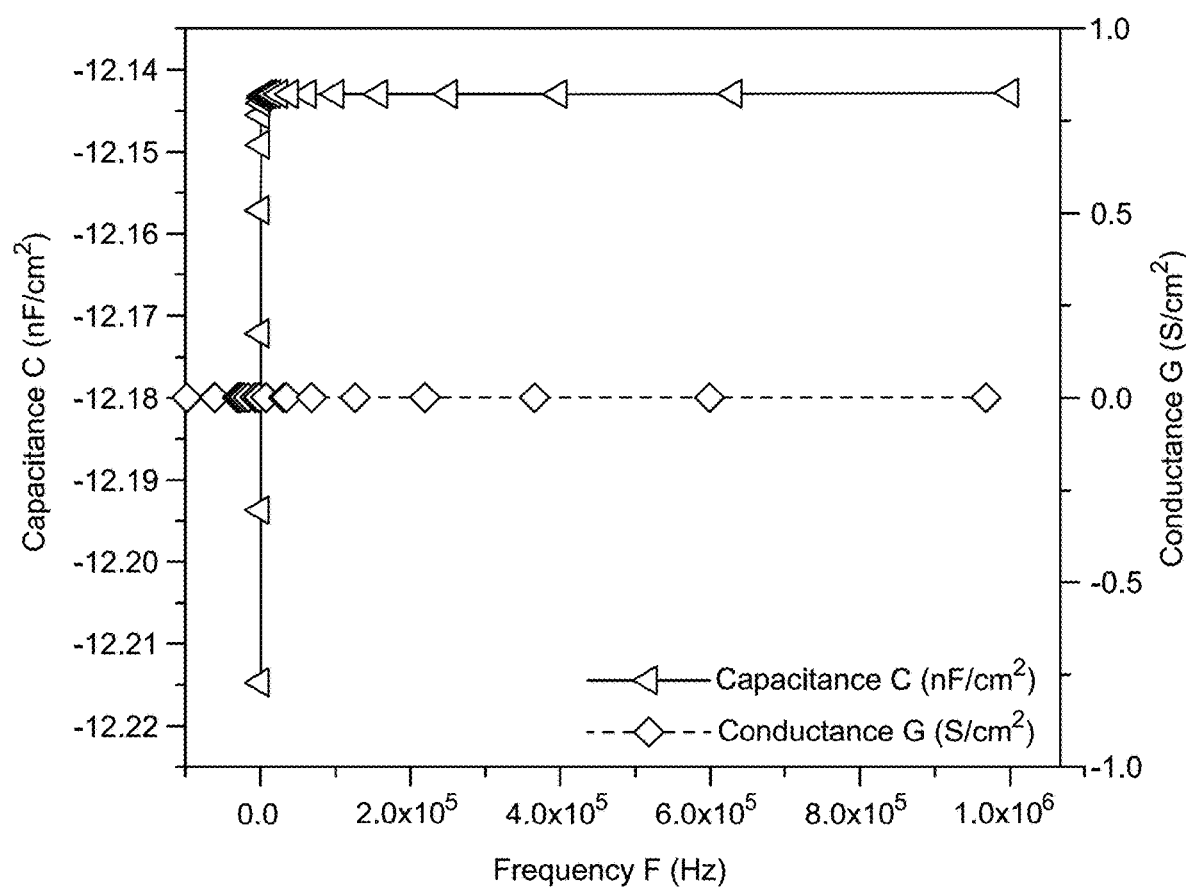
FIG. 10 is a plot showing the effect of frequency on capacitance and conductance for the double-absorbers-based solar cell, according to certain embodiments.

The relationship between the improved solar cell's capacitance and conductance, as it fluctuates with frequency, is shown in FIG. 10. The existence of series resistance probably causes the capacitance degradation to mostly occur at high frequencies (>300 kilohertz (kHz)), as seen in the picture. As a result, the solar cell's electrical properties are diminished.

Figure 11:
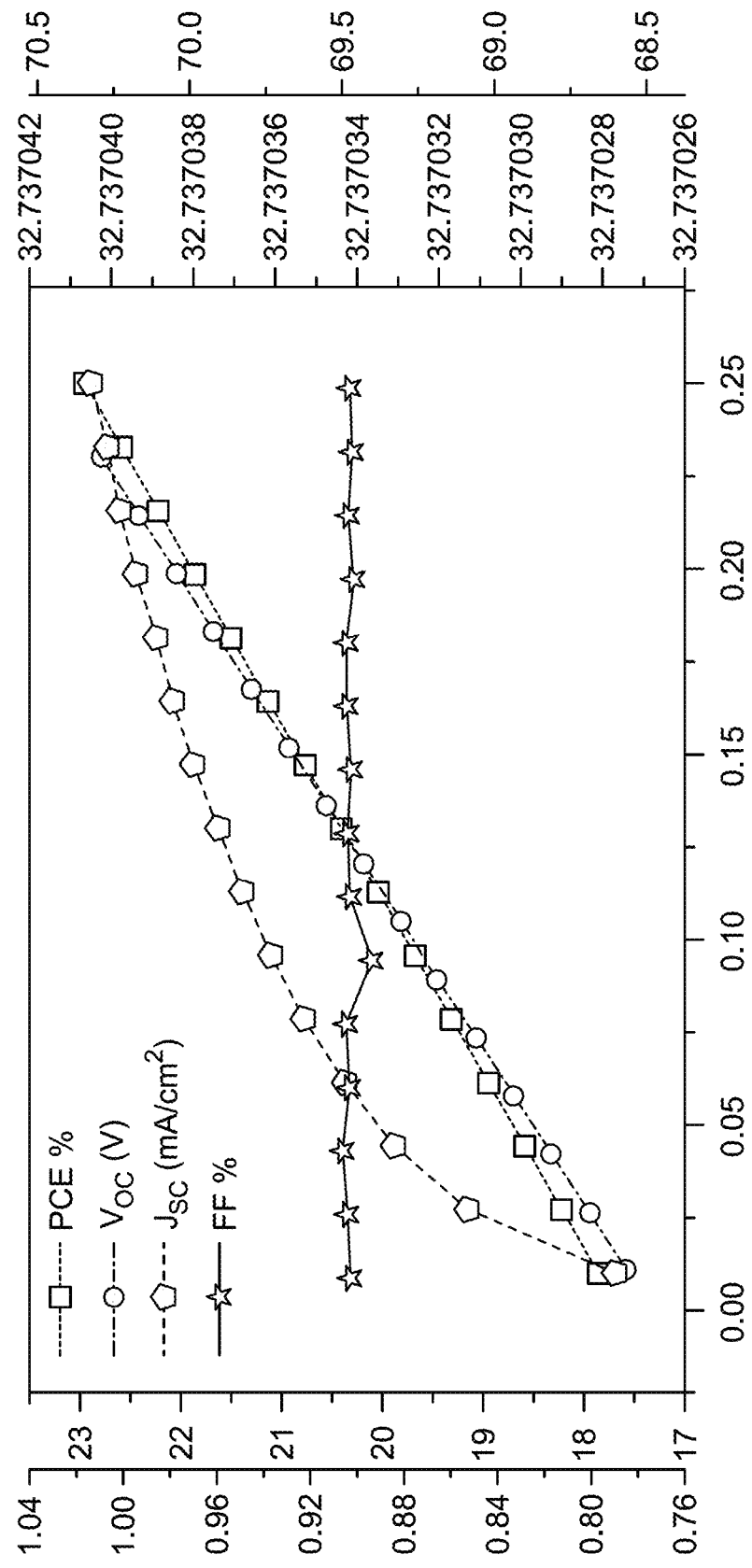
FIG. 11 is a plot showing the effect of copper oxide ($Cu_2O$) layer thickness on the performance of a solar cell based on double-absorbers, according to certain embodiments.

The effect of each structural layer on the device's functionality has been thoroughly investigated. The optimal thickness of $Cu_2O$ has been determined to have a role, as seen in FIG. 11. The original thickness of this layer was intentionally modified within the range of 0.01 μm to 0.5 μm. The electrical parameters for the device performance were determined by keeping the thickness values of the other layers at their ideal levels. Consequently, the interval was decreased to attain maximum efficiency while reducing costs associated with the system. A notable discovery is that the electrical characteristics are enhanced due to the heightened affinity of $Cu_2O$ to gather charge carriers from the absorber material and facilitate their transmission to the metal contacts. Enhanced electrical characteristics may indicate a more robust connection between $Cu_2O$ and the absorber material. $Cu_2O$ has a high aspect ratio, higher carrier mobility, increased transparency, improved chemical stability, and stronger mechanical strength, which render it very suitable for improving the efficiency of PV devices. Consistently, the electrical characteristics demonstrated that the device attained a performance with an efficiency above 20% and a fill factor surpassing 69% at the ideal value of 0.12 μm. In conclusion, $Cu_2O$'s favorable physicochemical properties, abundance, industrial advantages, environmental compatibility, and cost-effectiveness make it a promising candidate for solar cell applications.

Figure 12:
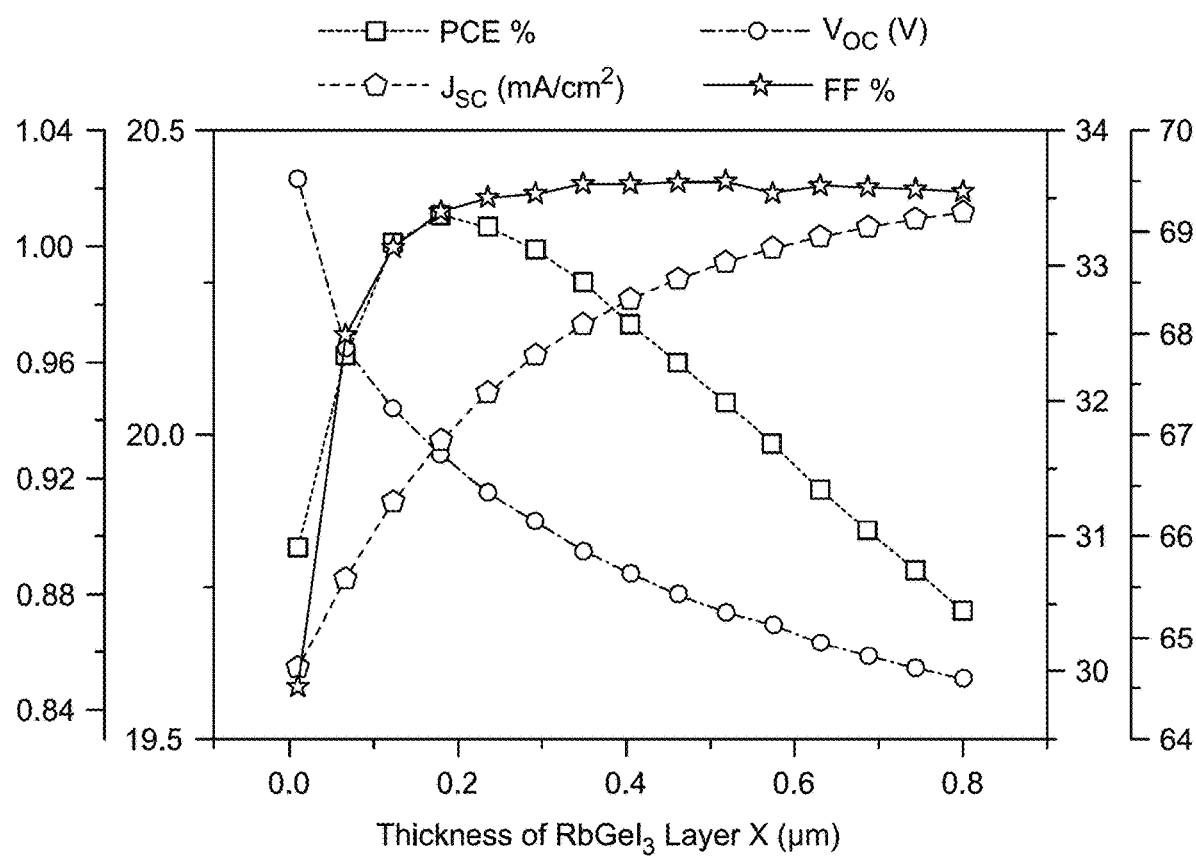
FIG. 12 is a plot showing the impact of the rubidium germanium iodide ($RbGeI_3$) layer's thickness on the performance characteristics of solar cells using double-absorbers, according to certain embodiments.

The empirical and theoretical analyses provide evidence that $RbGeI_3$ exhibits remarkable optical sensitivity in both the visible and ultraviolet and visible parts of the electromagnetic spectrum. The measured band gap of 1.31 eV indicates that it could be a viable substitute for lead (Pb) based absorber materials, which are known to be poisonous and harmful. The electrical characteristics of the solar cell were examined by systematically adjusting and optimizing the thickness, as seen in FIG. 12. The initial layer thickness was adjusted from 0.01 μm to 5 μm, and the resulting changes in electrical characteristics were tracked down. In conclusion, after analyzing the pattern, the thickness was fine-tuned to enhance the efficiency and cost-effectiveness of the construction. The device exhibited optimal performance when the $RbGeI_3$ layer had a thickness of 0.4 μm. At this thickness, the measured efficiency exceeded 20% and the fill factor exceeded 69%. $RbGeI_3$ possesses distinct features and optical qualities that qualify it as a promising contender for PV applications.

Figure 13:
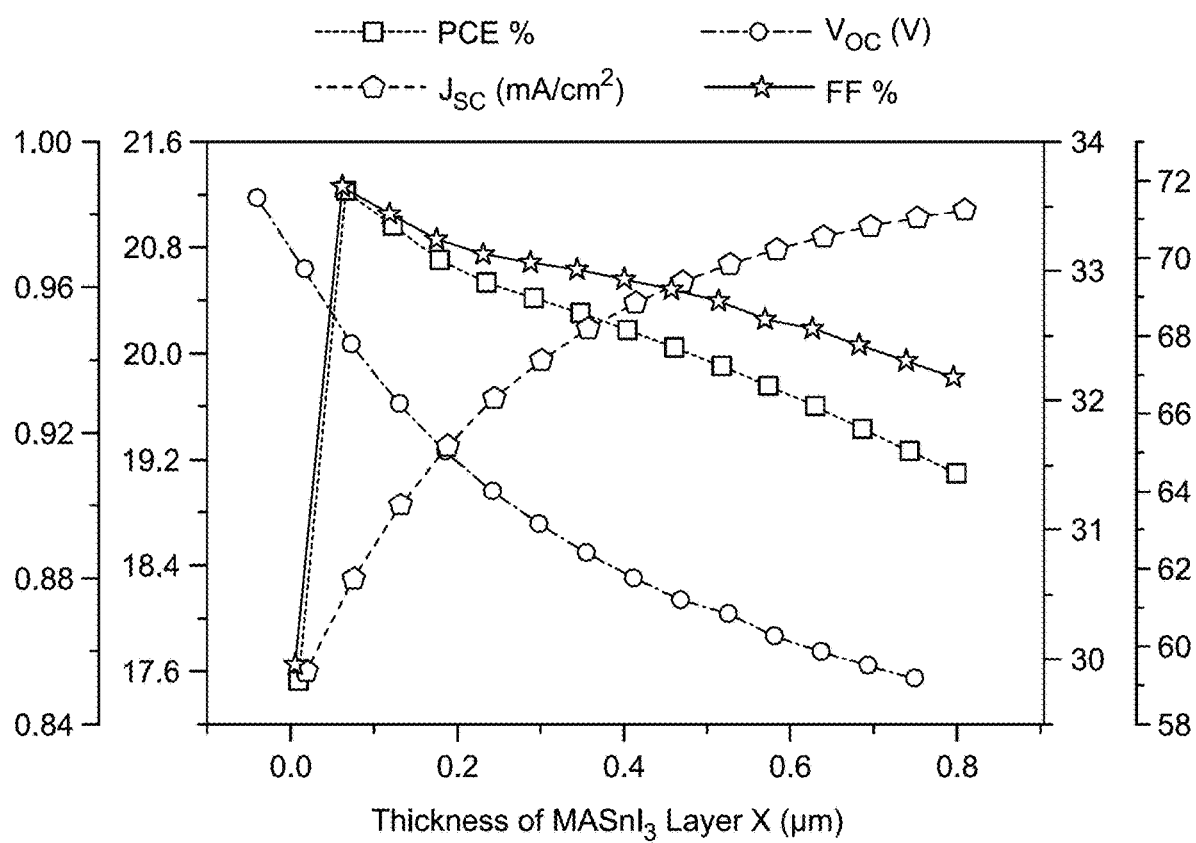
FIG. 13 is a plot showing the impact of the methylammonium tin iodide ($MASnI_3$) layer on the performance parameters of a solar cell with dual absorbers, according to certain embodiments.
Figure 14:
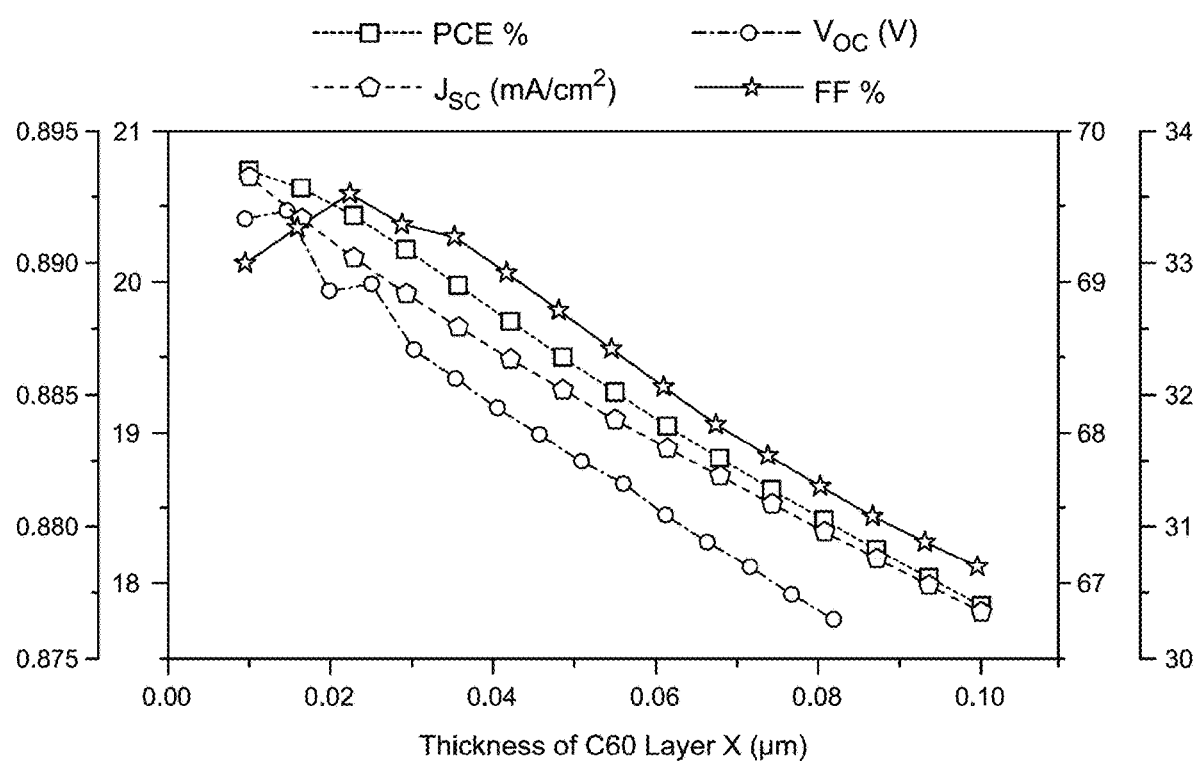
FIG. 14 is a plot showing the effects of the fullerene ($C_{60}$) thickness on the performance characteristics of a solar cell with double-absorbers, according to certain embodiments.
Figure 15A:
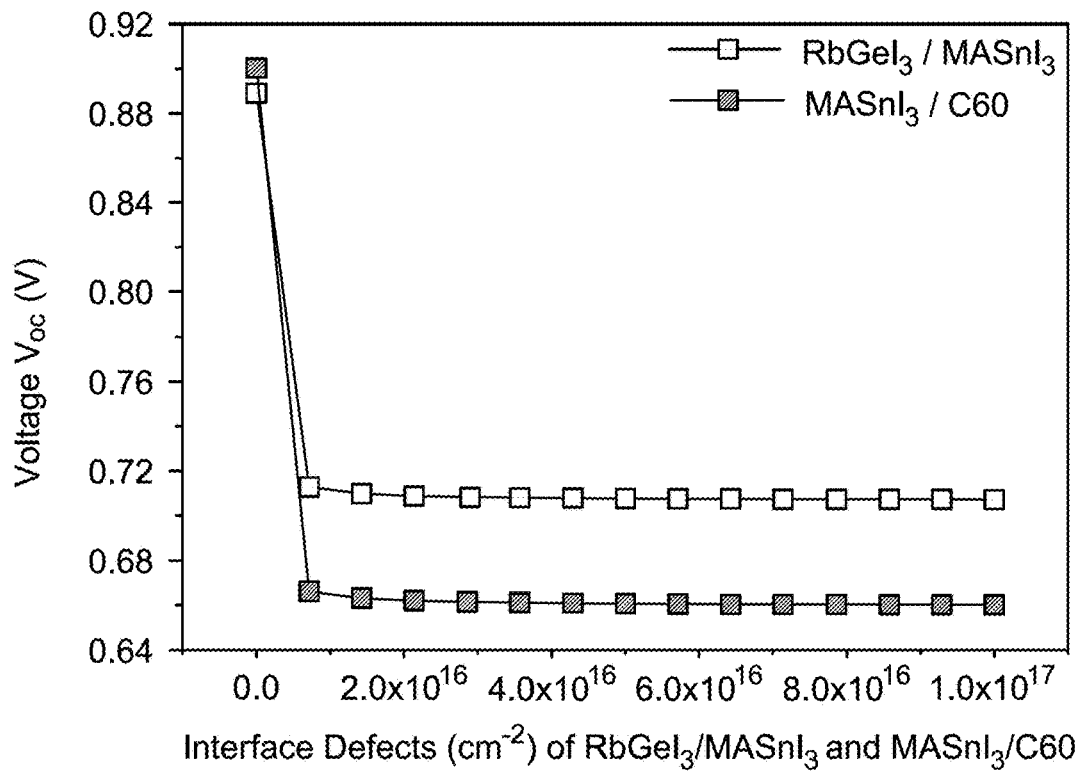
FIG. 15A is a plot showing the impact of interface fault density on the open-circuit voltage ($V_{oc}$) of $RbGeI_3/MASnI_3$ and $MASnI_3/C_{60}$ systems, according to certain embodiments.
Figure 15B:
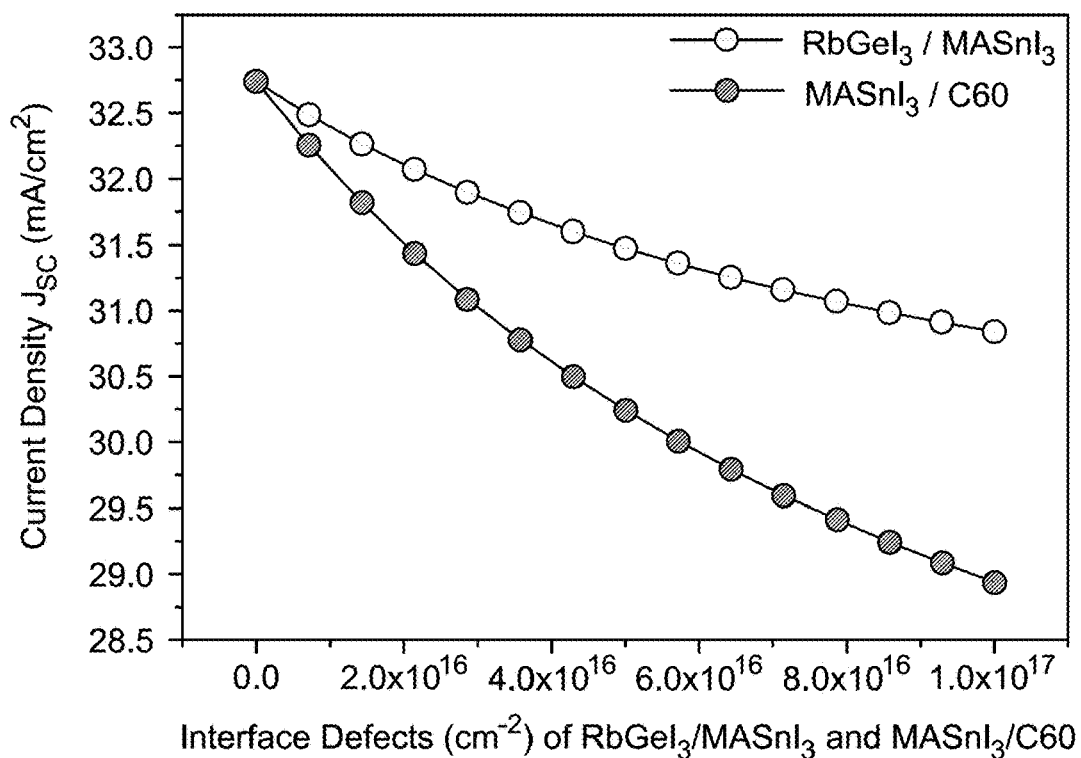
FIG. 15B is a plot showing the impact of interface fault density on the current density ($J_{sc}$) of $RbGeI_3/MASnI_3$ and $MASnI_3/C_{60}$ systems, according to certain embodiments.
Figure 15C:
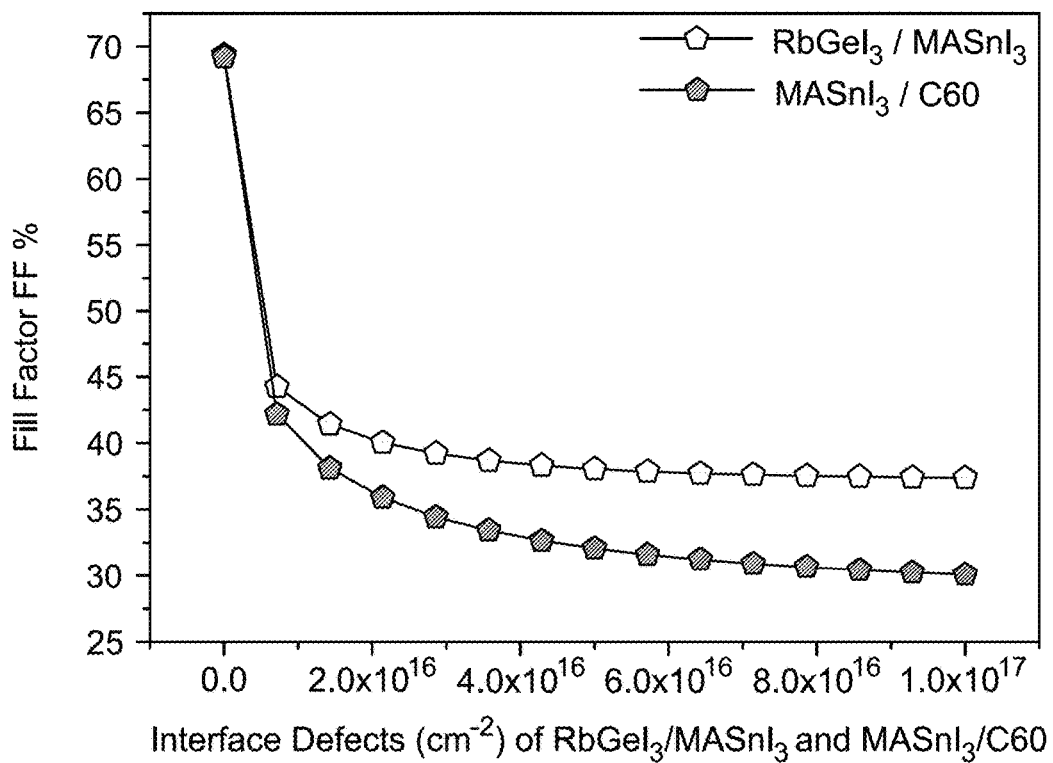
FIG. 15C is a plot showing the impact of interface fault density on the fill factor (FF) of $RbGeI_3/MASnI_3$ and $MASnI_3/C_{60}$ systems, according to certain embodiments.
Figure 15D:
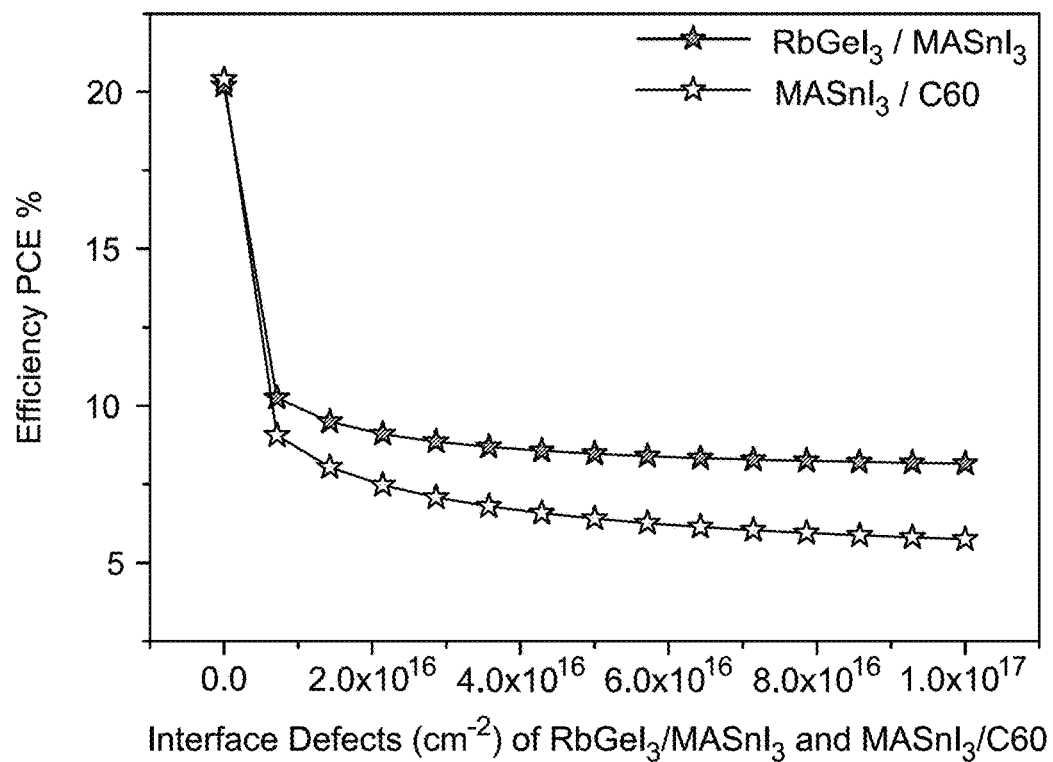
FIG. 15D is a plot showing the impact of interface fault density on the power conversion efficiency of $RbGeI_3/MASnI_3$ and $MASnI_3/C_{60}$ systems, according to certain embodiments.

FIG. 13 displays the relationship between the thickness of the $MASnI_3$ absorber and various electrical parameters. The current density, power conversion efficiency and open circuit voltage exhibits a gradual rise as the layer thickness increases, with the exception of the fill factor. A thicker absorber layer can result in a higher concentration of charge carriers. The PCE was measured as 20.5%, the open circuit voltage was simulated as 0.9 V, the current density of 32.2 $mA/cm^2$, and the fill factor of the system is measured as 69%. FIG. 14 displays the relationship between several electrical factors and the modification of layer thickness of the $C_{60}$ ETL. The optimal thickness is determined to be 0.03 microns.

FIG. 15A-15D illustrates the impact of interface fault density on the $V_{oc}$, $J_{sc}$, FF, and power conversion efficiency of $RbGeI_3/MASnI_3$ and $MASnI_3/C_{60}$ systems, respectively. The plots indicate that $V_{oc}$, $J_{sc}$, FF, and power conversion efficiency exhibit a drop-in response to high interface defect density. As the number of defects in the material rises, the speed at which recombination happens also increases, leading to a fall in the power conversion efficiency, current density, open circuit voltage, and fill factor. The elevated defect concentrations at the two interfaces lead to a greater abundance of traps and recombination centers, which in turn leads to a decline in the overall performance of the solar cell.

Figure 16:
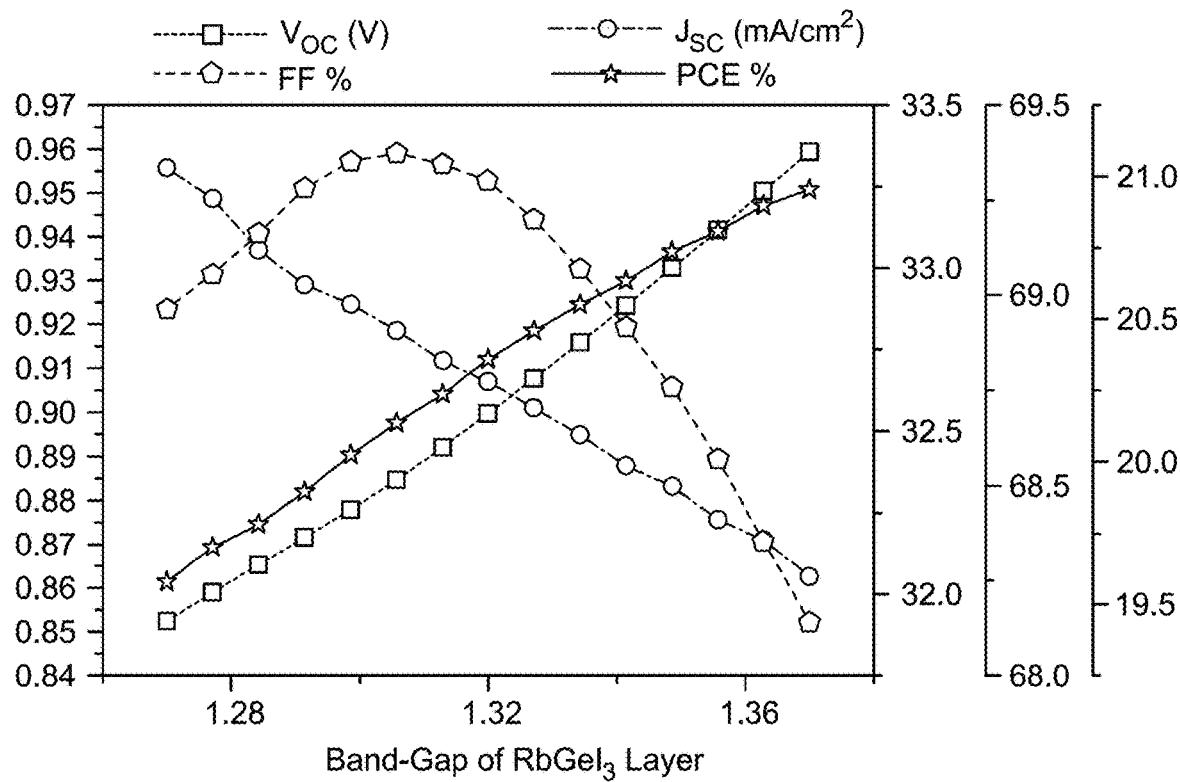
FIG. 16 is a plot showing the impact of the energy bandgap on the performance characteristics of the $RbGeI_3$ absorber layer, according to certain embodiments.
Figure 17:
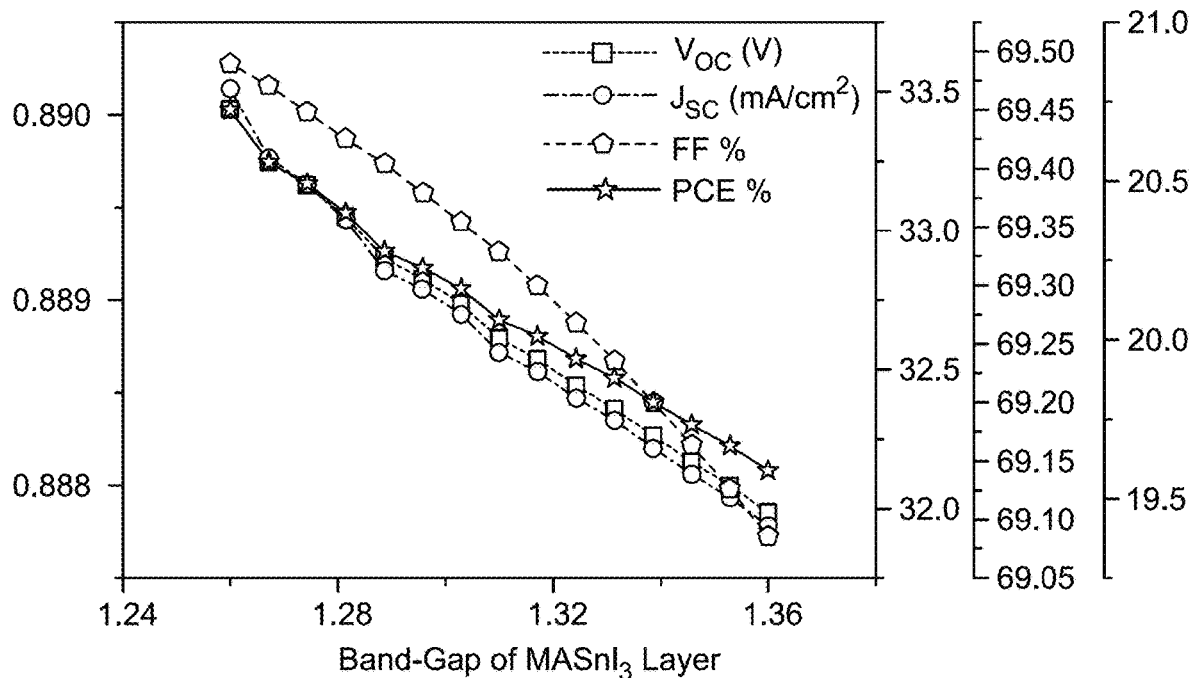
FIG. 17 is a plot showing the impact of the energy bandgap on the performance characteristics of the $MASnI_3$ absorber layer, according to certain embodiments.

The impact of the energy bandgap of $RbGeI_3$ on the performance characteristics is analyzed, as depicted in FIG. 16. The energy band gap was observed to rise from 1.26 to 1.36 eV. The values of $V_{oc}$ and power conversion efficiency rise as the band gap grows. The $V_{oc}$ rose from 0.85 V to 0.96 V, while the power conversion efficiency increased from 19.6% to 21.2%. A decline in the $J_{sc}$ was observed from 33.5 to 32 $mA/cm^2$, accompanied by an increase in the band gap. The FF exhibited an increase from 68.8% to 69.4% at an energy level of 1.30 eV, but then decreased with an increase in bandwidth to a value of 68.1%. An analysis is conducted on the influence of the energy bandgap of $MASnI_3$ on the performance characteristics, as shown in FIG. 17. The rise in the energy band gap to 1.36 eV likely resulted in a noticeable decrease across all electric parameters, indicating a probable increase in the recombination rate of charge carriers, possibly attributed to an augmented diffusion length.

Figure 18:
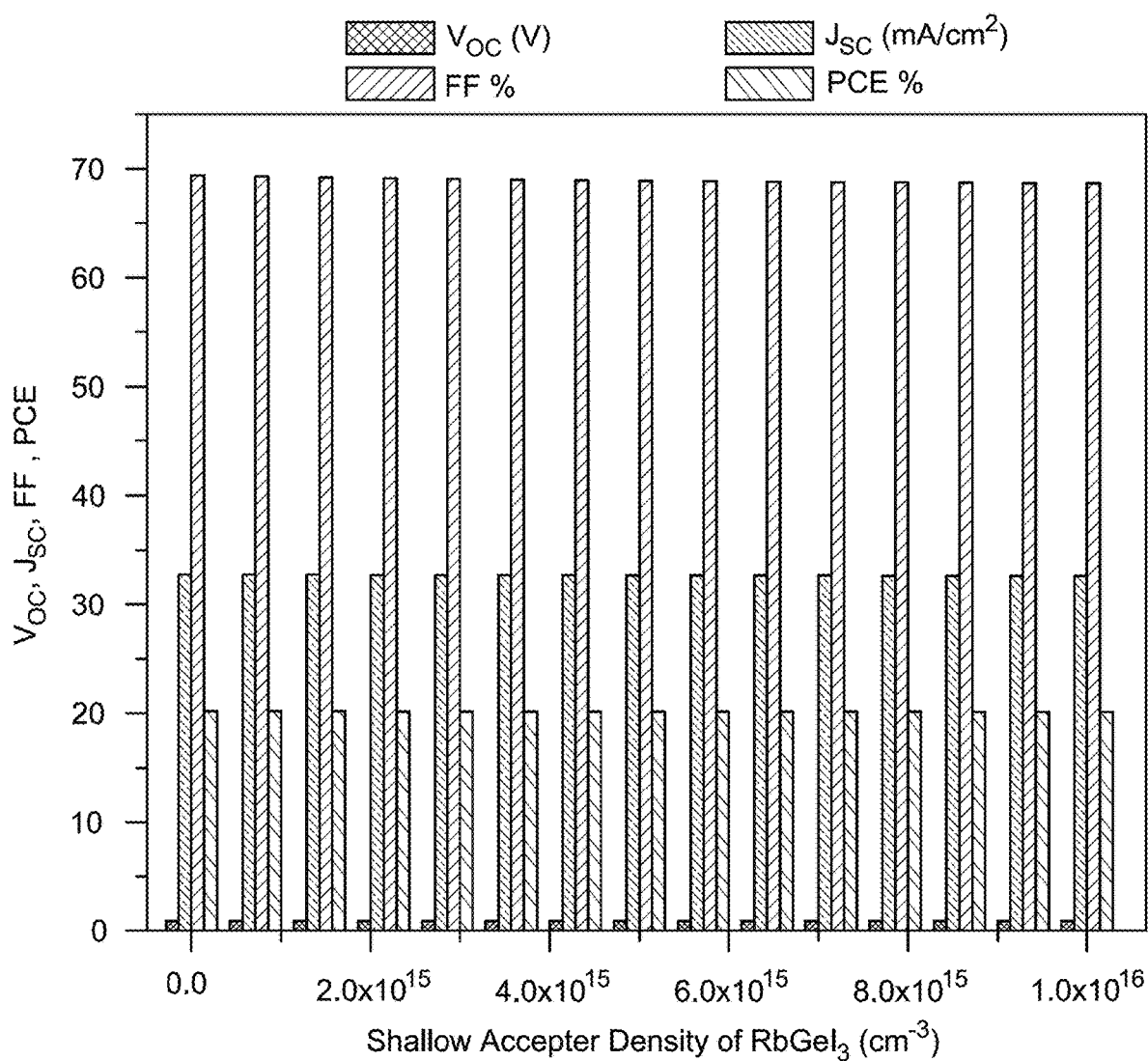
FIG. 18 is a plot showing the impact of the shallow acceptor density of $RbGeI_3$ on the performance characteristics of a solar cell using improved double-absorbers, according to certain embodiments.
Figure 19:
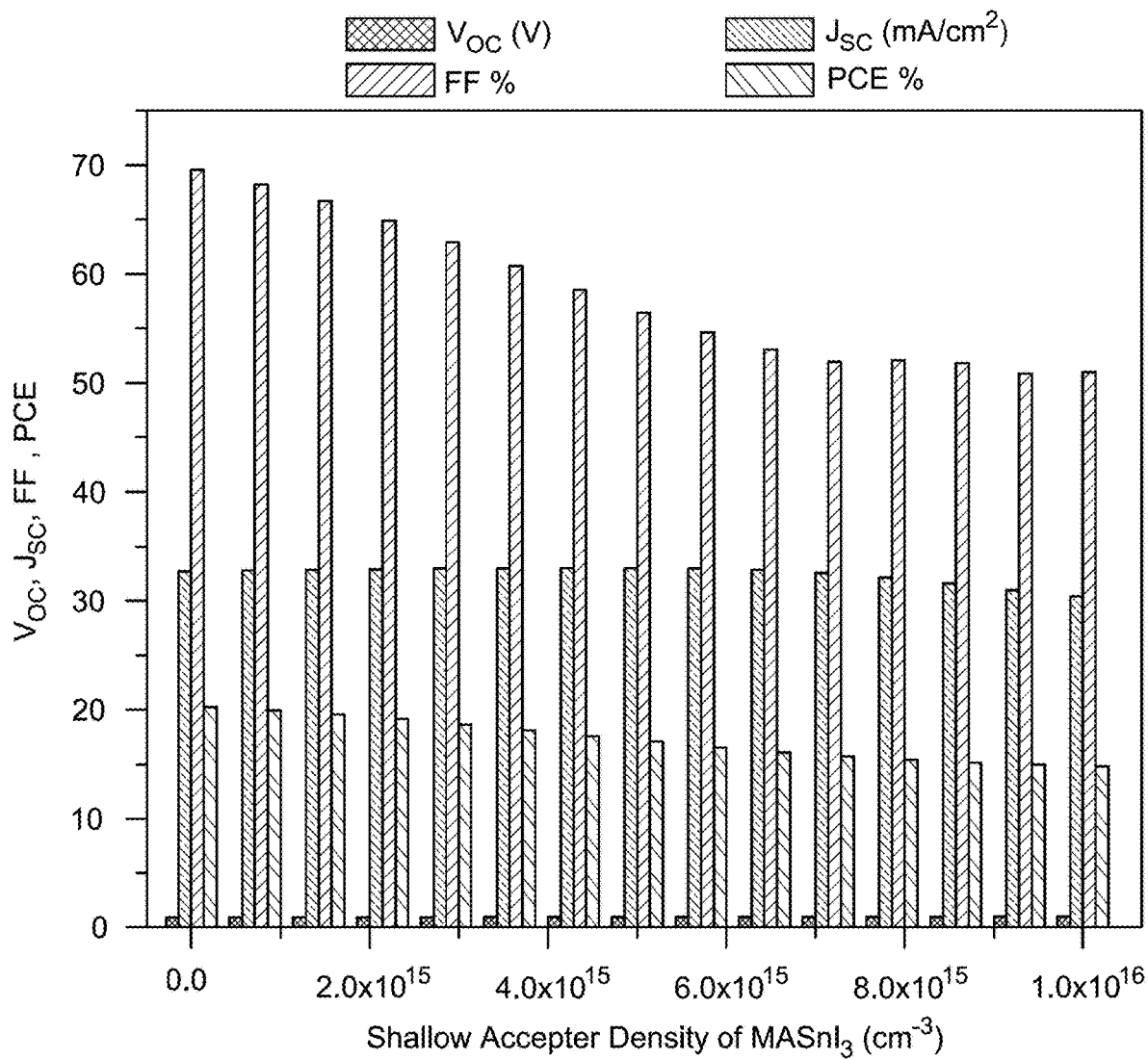
FIG. 19 is a plot showing the effects of the shallow acceptor density of $MASnI_3$ on the performance characteristics of a solar cell with double-absorbers, according to certain embodiments.
Figure 20A:
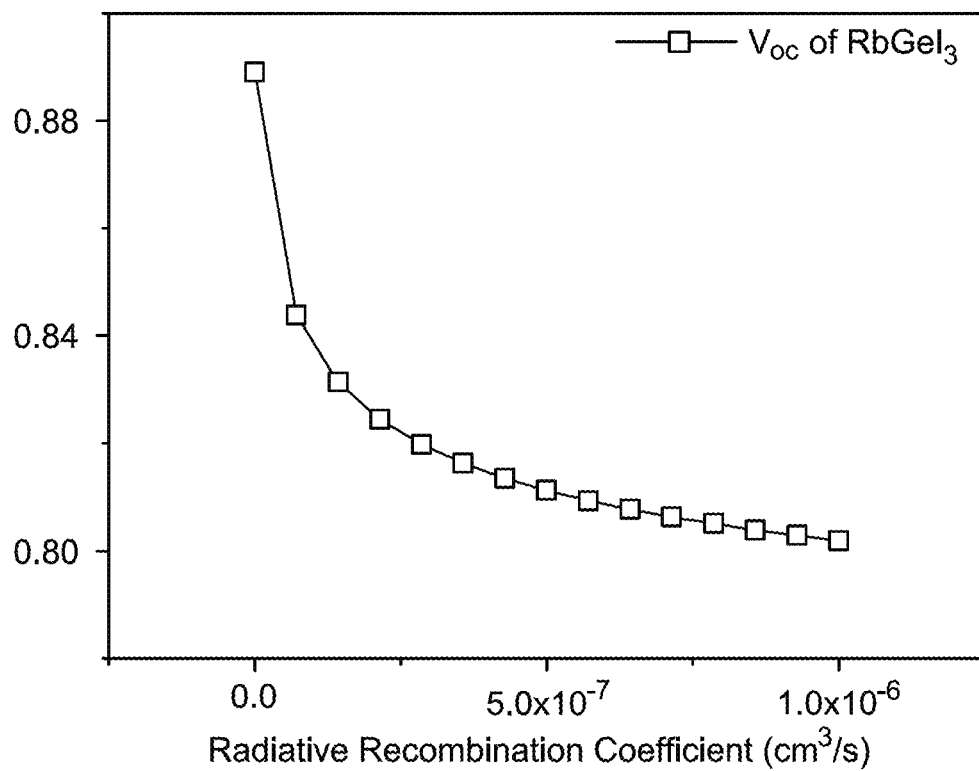
FIG. 20A is a plot showing the effect of radiative recombination on $V_{oc}$ of solar cell $RbGeI_3$, according to certain embodiments.
Figure 20B:
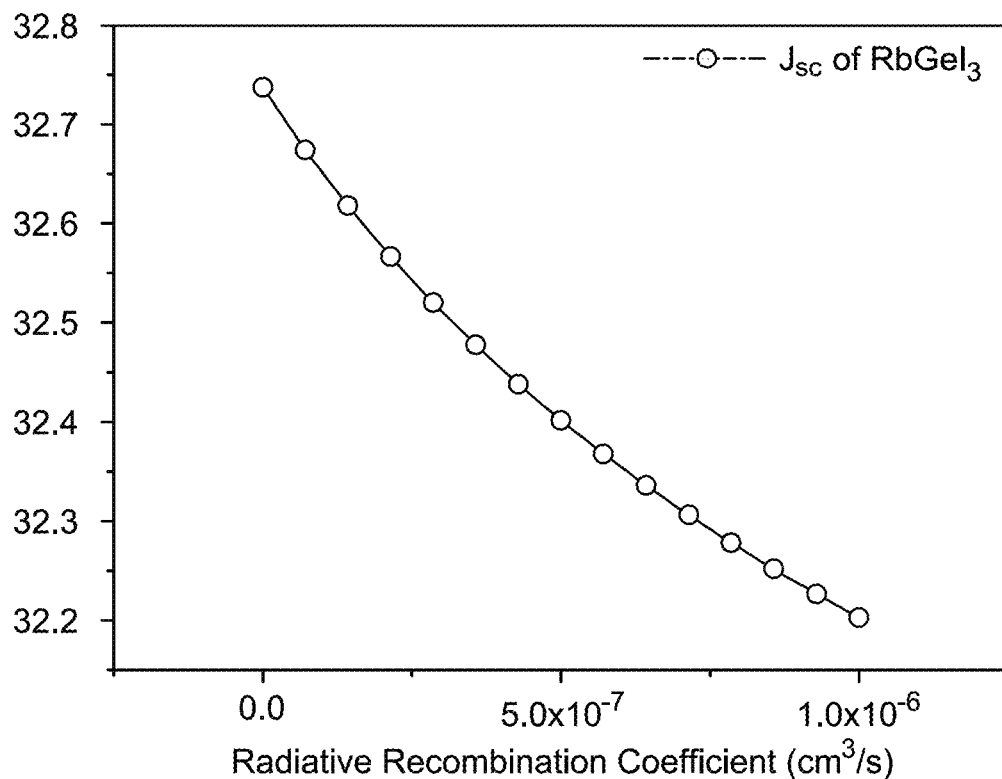
FIG. 20B is a plot showing the effect of radiative recombination on $J_{sc}$ of solar cell $RbGeI_3$, according to certain embodiments.
Figure 20C:
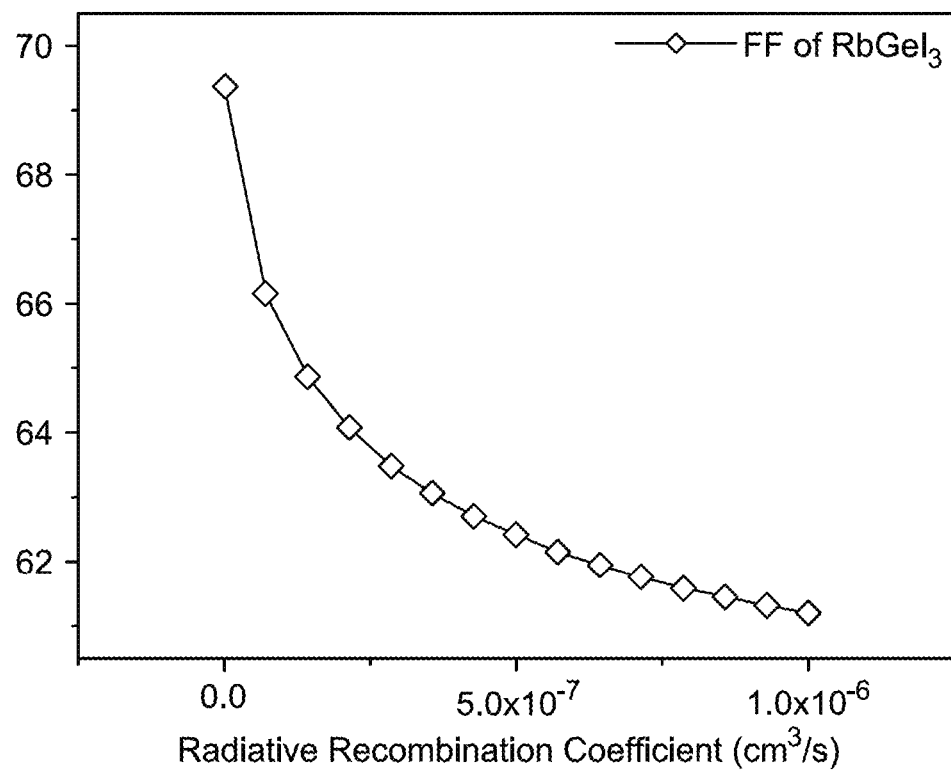
FIG. 20C is a plot showing the effect of radiative recombination on FF of solar cell $RbGeI_3$, according to certain embodiments.
Figure 20D:
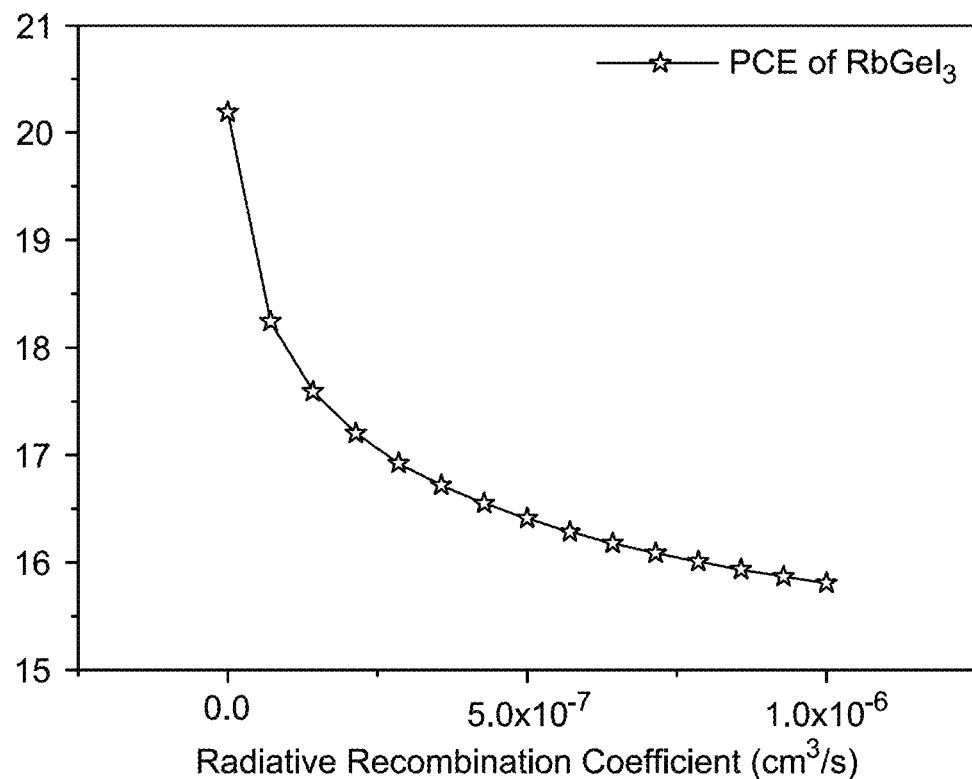
FIG. 20D is a plot showing the effect of radiative recombination on power conversion efficiency of solar cell $RbGeI_3$, according to certain embodiments.
Figure 21A:
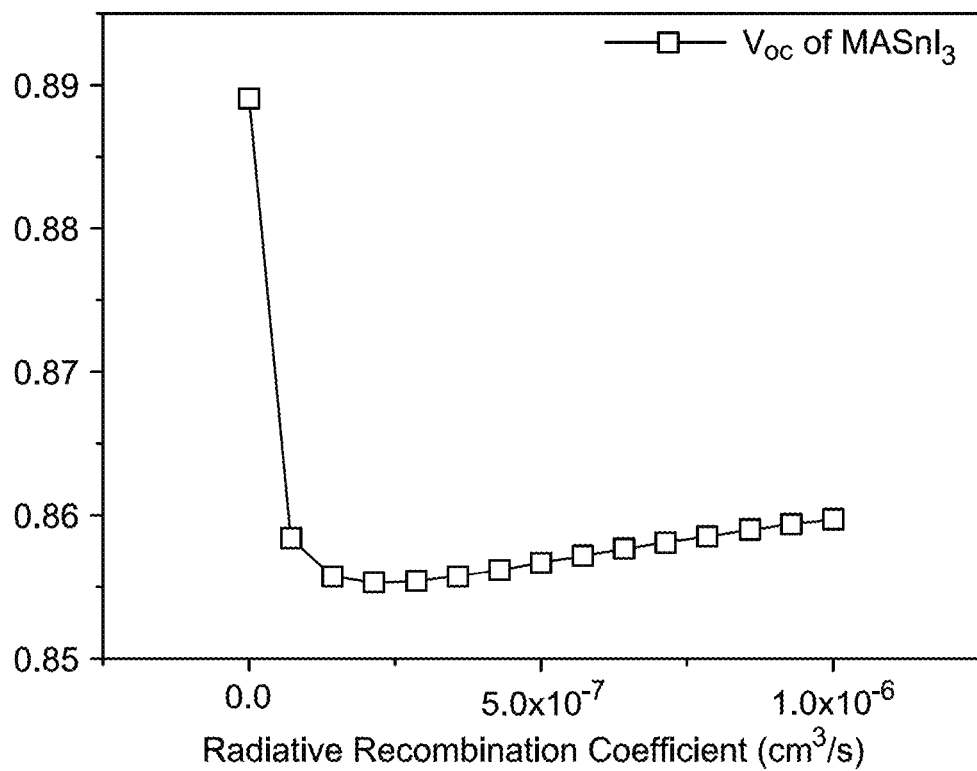
FIG. 21A is a plot showing the effect of radiative recombination on $V_{oc}$ of solar cell $MASnI_3$, according to certain embodiments.
Figure 21B:
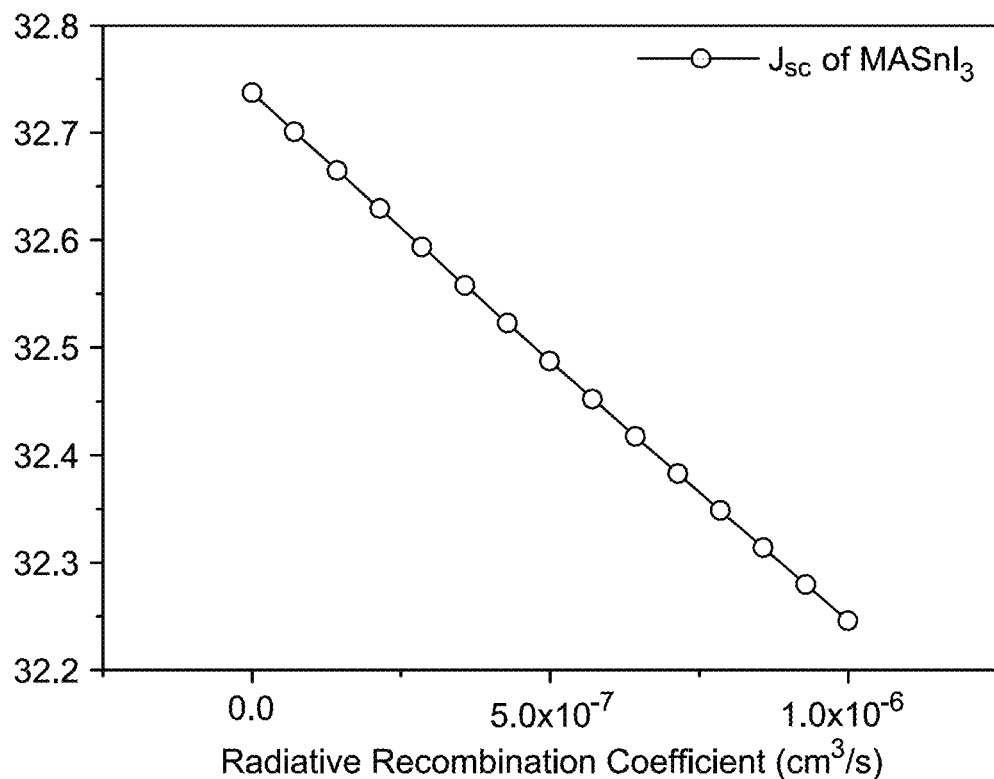
FIG. 21B is a plot showing the effect of radiative recombination on $J_{sc}$ of solar cell $MASnI_3$, according to certain embodiments.
Figure 21C:
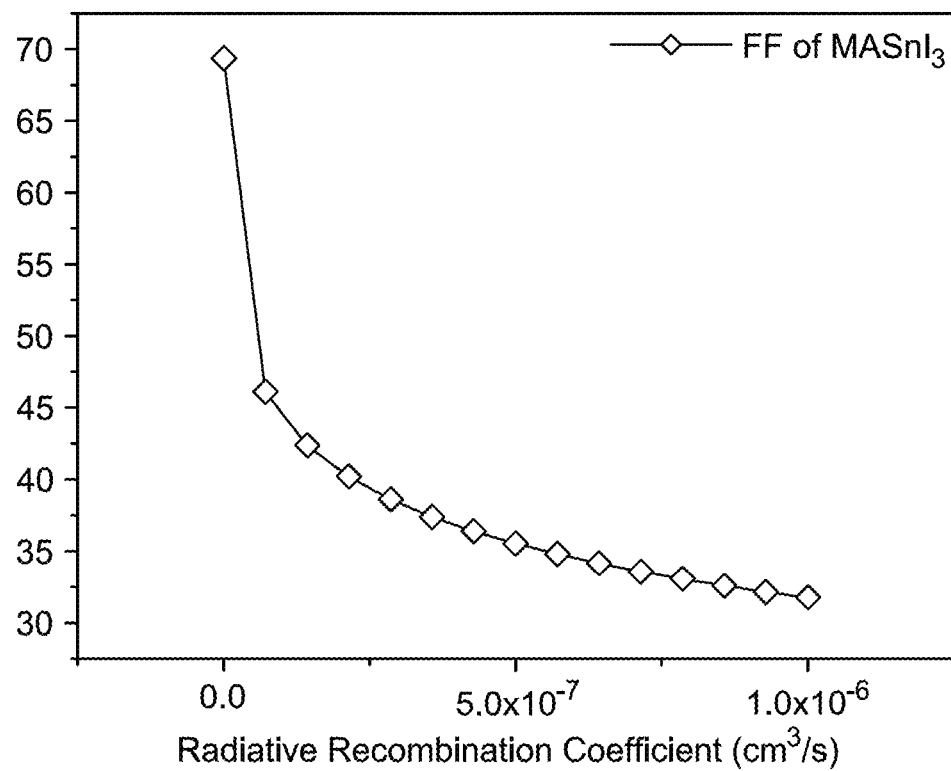
FIG. 21C is a plot showing the effect of radiative recombination on FF of solar cell $MASnI_3$, according to certain embodiments.
Figure 21D:
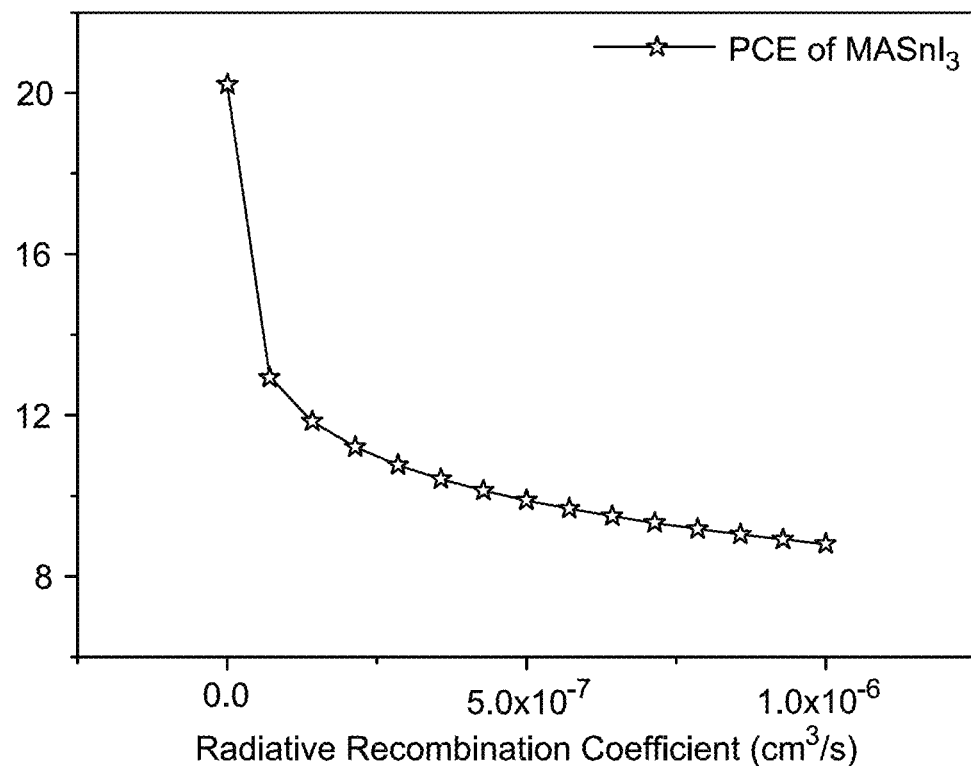
FIG. 21D is a plot showing the effect of radiative recombination on power conversion efficiency of solar cell $MASnI_3$, according to certain embodiments.

The influence of the low acceptor density of $RbGeI3$ and $MASnI3$ on the effectiveness of solar cells has been examined by modifying it within the range of 0 to $1 \times 10^{16}$ $cm^{-3}$. The findings obtained from the simulation are presented in FIG. 18 and FIG. 19 (In supplementary material as S9 and S10). The $V_{oc}$ remains nearly constant as the shallow acceptor density increases for RbGeI$_3$ and MASnI$_3$. The $J_{sc}$, FF, and power conversion efficiency of RbGeI$_3$ remain stable as the shallow acceptor density (g), increases from 0 to $1 \times 10^{16}$ cm$^{-3}$. The fill factor (FF) for MASnI$_3$ reduces from 70% to 53%. The $J_{sc}$ declines by 4 percentage points, from 33% to 29%. The power conversion efficiency declines from 20% to 15% as the shallow acceptor density (g) increases from 0 to $1 \times 10^{16}$ cm$^{-3}$. The observed decrease may be attributed to the widening of the energy band gap in the MASnI$_3$ layer, which in turn could lead to an increase in the diffusion length and hence the performance of the device.

FIG. 20A-20D illustrates the correlation between the electrical parameters and the radiative recombination rates of the RbGeI3 absorber layer, showing the effect of radiative recombination $V_{oc}$, $J_{sc}$, FF, and power conversion efficiency of solar cell RbGeI$_3$, respectively. Conversely, FIG. 21A-21D depicts a similar relationship for the MASnI$_3$ absorber layer. FIG. 21A-21D shows the effect of radiative recombination $V_{oc}$, $J_{sc}$, FF, and power conversion efficiency of solar cell MASnI$_3$, respectively. The electrical performance declines as the radiative recombination coefficients increase. The emission of a photon at the bandgap energy occurs when an electron in the conduction band combines with a hole in the valence band. In order to choose an optimal direct bandgap layer material, the radiative recombination of carriers should be considered, since this process may provide the highest level of power efficiency in devices. These simulation results demonstrate that the double active layer structure including MASnI$_3$ and RbGeI$_3$ achieves a higher power conversion efficiency compared to single active layer configurations. For instance, a power conversion efficiency of 20.19% is shown in this study, which is higher than the reported power conversion efficiencies of single active layer systems cited in the literature [Hao, F., et al., Lead-free solid-state organic-inorganic halide perovskite solar cells, *Nature Photonics*, volume 8, pages 489-494, 2014; Hao, F. et al., Anomalous band gap behavior in mixed Sn and Pb perovskites enables broadening of absorption spectrum in solar cells, *J Am Chem Soc.*, 2014, 136, 22, 8094-9; Li, F., et al., A cation-exchange approach for the fabrication of efficient methylammonium tin iodide perovskite solar cells, *Angew Chem Int Ed Engl.*, 2019, 58, 20, 6688-6692]. This improvement can be attributed to improved light absorption, reduced recombination losses, etc. By incorporating this comparison, a clearer representation of the enhanced efficiency obtained with the proposed double active layer approach is aimed to be provided.

Figure 22:
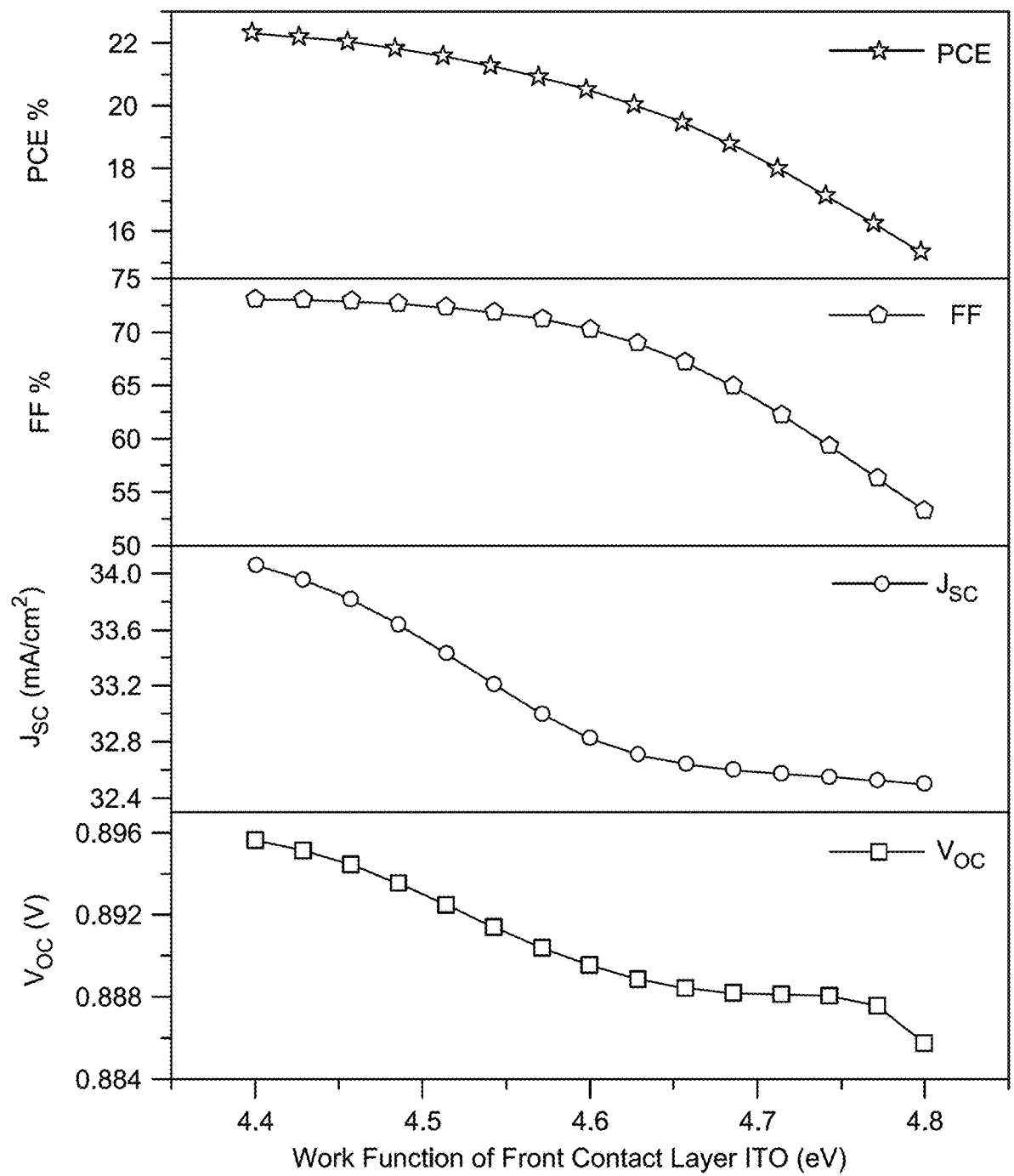
FIG. 22 is a comparison of the work function of the front-contact layer (ITO) with the electrical properties of solar cells, according to certain embodiments.
Figure 23:
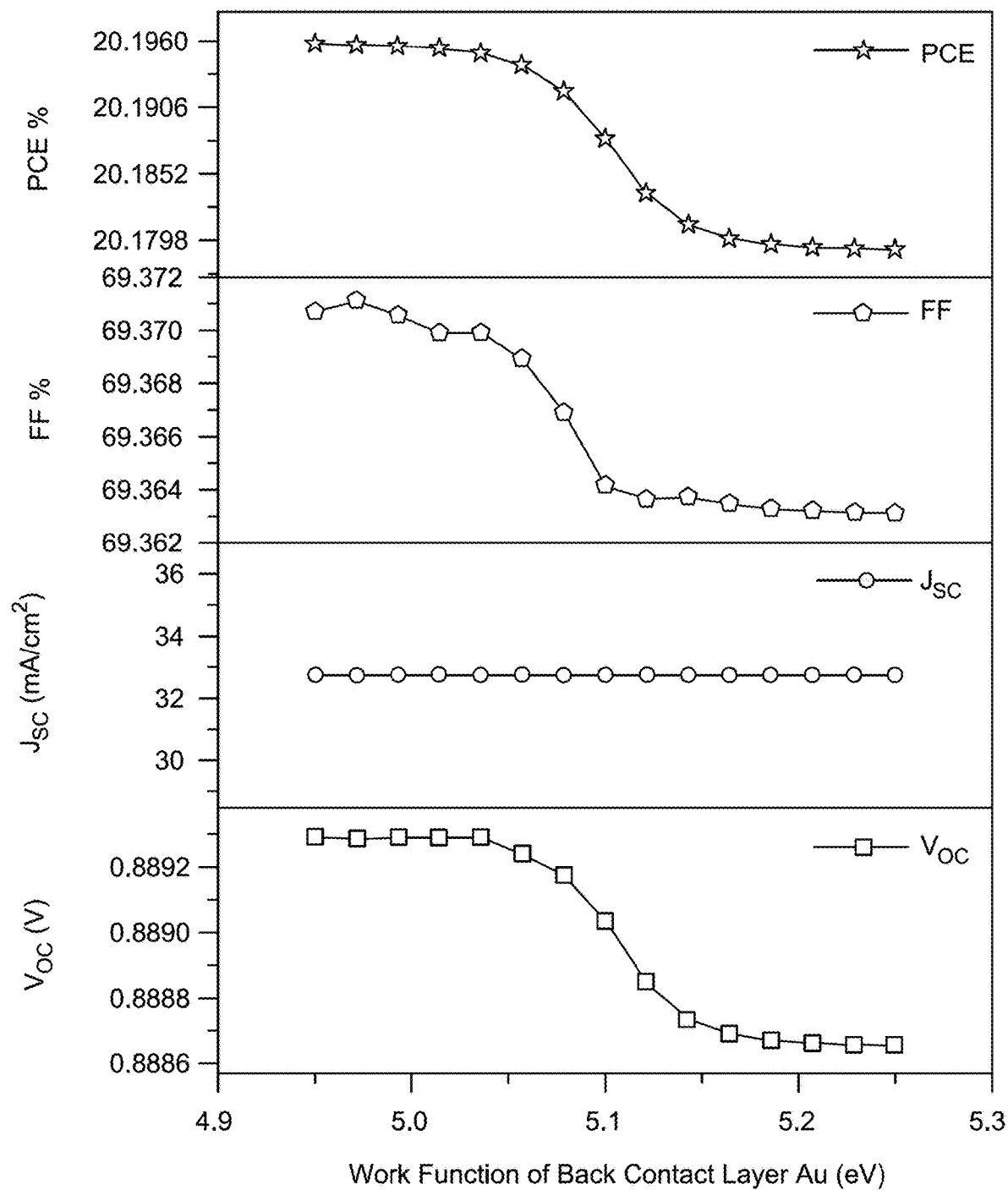
FIG. 23 is a comparison of the work function of the back-contact layer (Au) with the electrical characteristics of improved solar cells, according to certain embodiments.
Figure 24A:
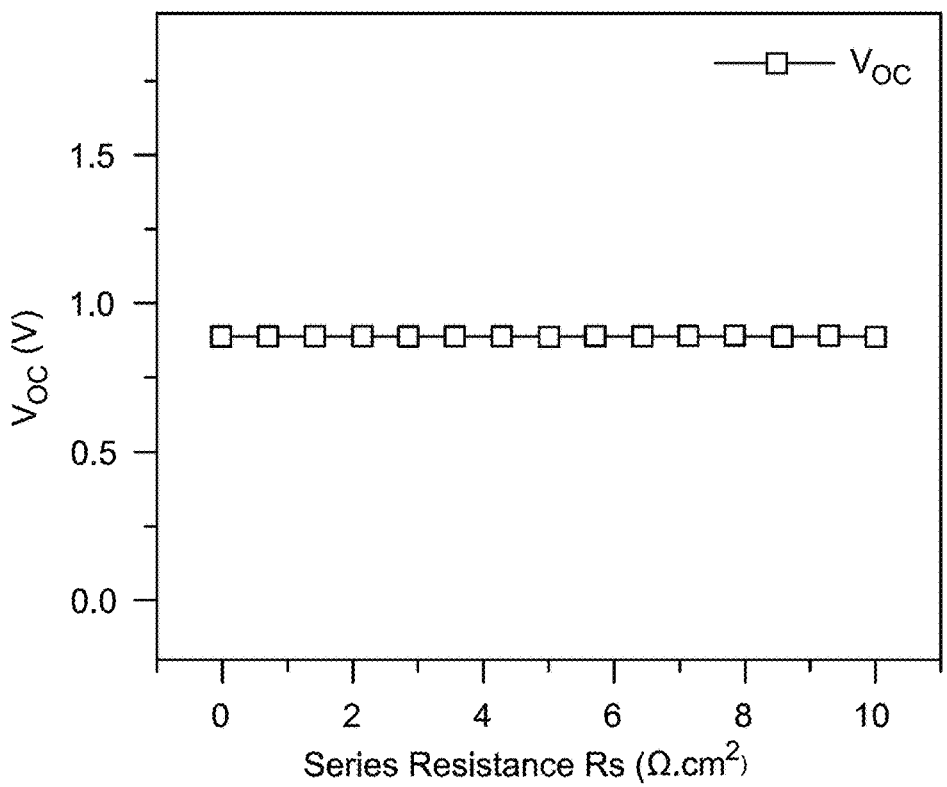
FIG. 24A is a plot showing the electrical property $V_{oc}$ versus series resistance of the proposed photovoltaic cell, according to certain embodiments.
Figure 24B:
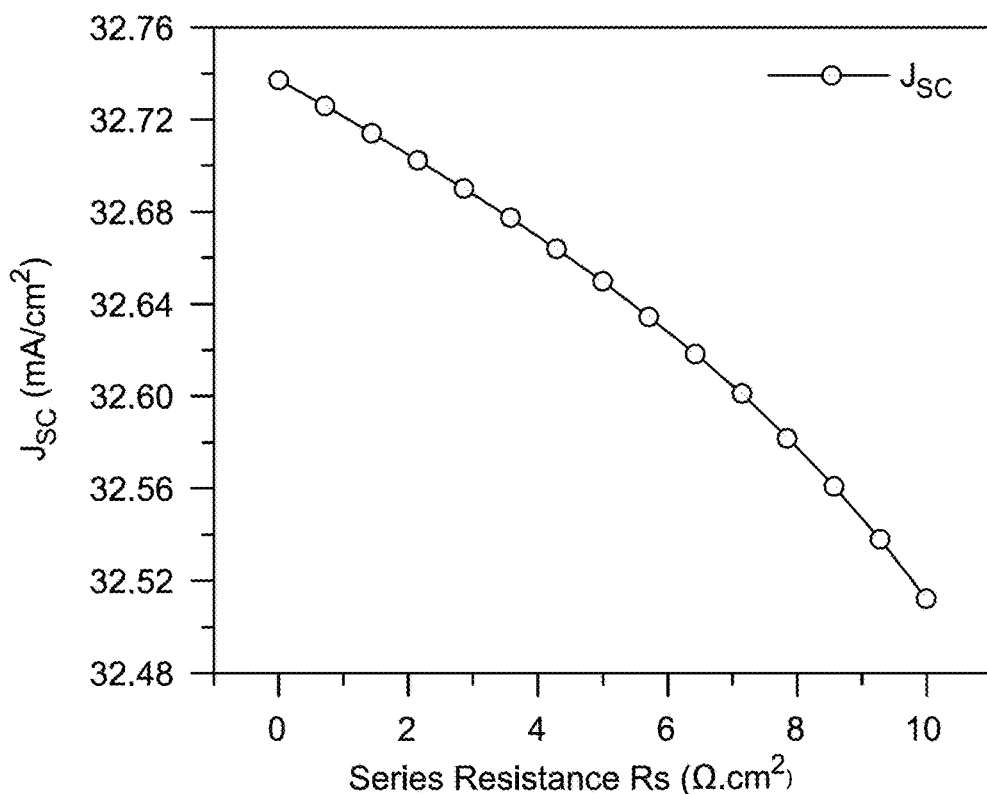
FIG. 24B is a plot showing the electrical property $J_{sc}$ versus series resistance of the proposed photovoltaic cell, according to certain embodiments.
Figure 24C:
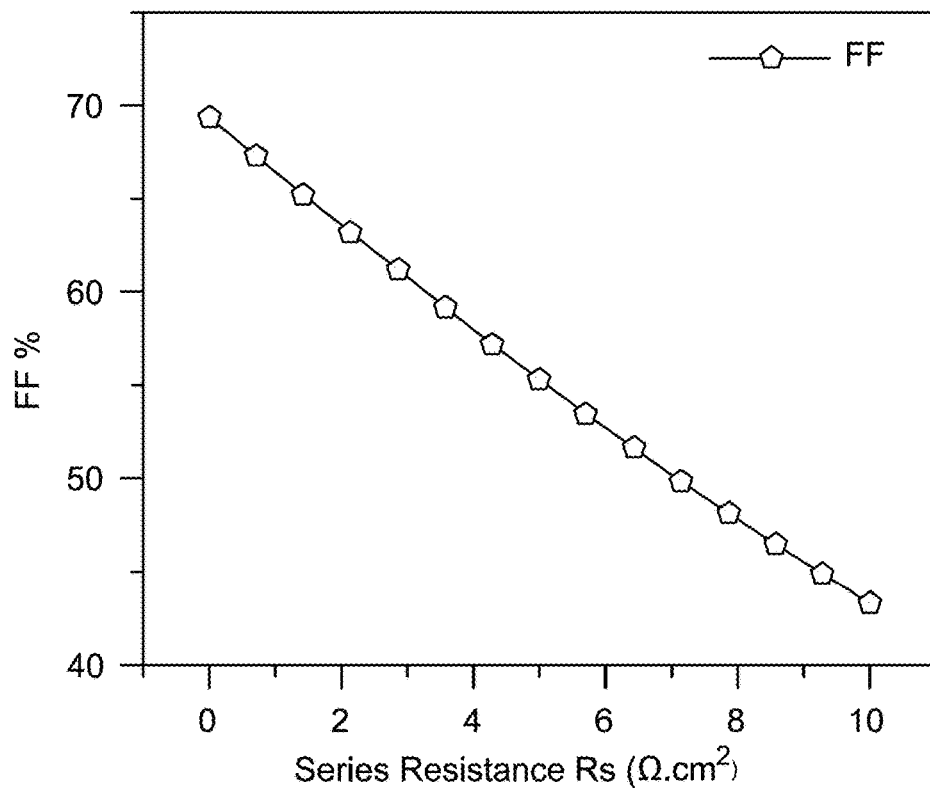
FIG. 24C is a plot showing the electrical property FF versus series resistance of the proposed photovoltaic cell, according to certain embodiments.
Figure 24D:
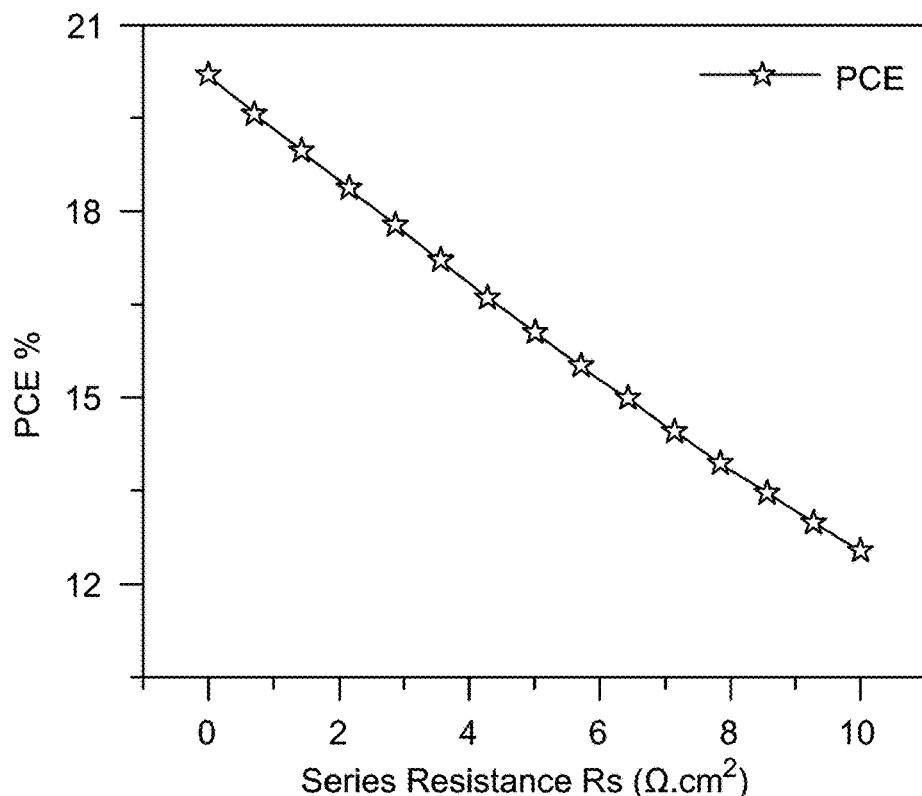
FIG. 24D is a plot showing the electrical property power conversion efficiency versus series resistance of the proposed photovoltaic cell, according to certain embodiments.

The front-contact impacts the electrical and optical characteristics of perovskite solar cells. Its main function is to facilitate the horizontal transport of charge carriers to the terminals and to enable efficient absorption of light while minimizing any losses in terms of optics. FIG. 22 investigates the influence of the front-contact layer on the efficiency of solar cells. This study compares different solar cells with various electron transport materials. The simulation of the cells is done by modifying the energy level of the front contact layer, which varied between 4.4 eV and 4.8 eV. Solar cell electrical properties, such as open-circuit voltage, short-circuit current density, and power conversion efficiency, have shown a decline when the energy bandgap of the front contact layer has grown to 4.8 eV. While, FIG. 23 presents an analysis of the influence of the back-contact layer, constructed of gold, on the efficiency of the solar cell. This analysis was conducted using solar cells that used different electron transport materials. The simulation included modifying the energy level of the back-contact layer, which varied between 4.95 eV and 5.25 eV. The electrical characteristics of solar cells' show a decrease when the back-contact layer increases to a value of 5.15 eV, afterwards, it almost remains constant.

Figure 25:
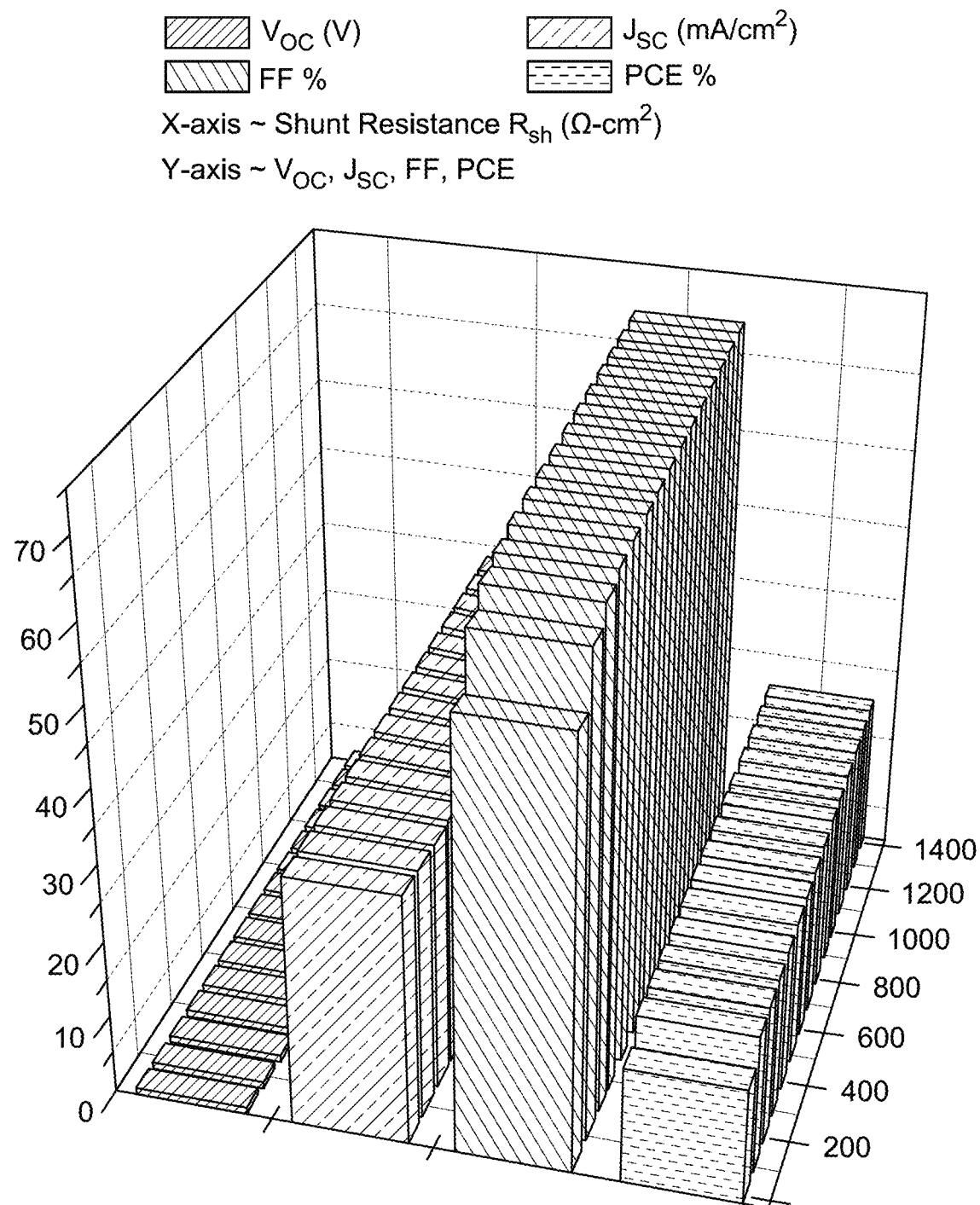
FIG. 25 is a plot showing the electrical parameters vs shunt resistance of the tandem perovskite solar cell, according to certain embodiments.

The series resistance electrical properties of the enhanced tandem perovskite solar cell are shown in FIGS. 24A-24D, depicting is a plot showing the electrical properties $V_{oc}$, $J_{sc}$, FF, and power conversion efficiency, respectively, versus series resistance of the proposed photovoltaic cell. FIG. 25 shows electrical parameters vs shunt resistance of the tandem perovskite solar cell. First, the current flowing through the solar cell's base and emitter; second, the resistance at the absorber-metal contact junction; and third, the resistance of the top and rear metal contacts—these three components combine to form the series resistance in a solar cell. As the series resistance increases, the picture clearly shows that electrical characteristics decrease. Since the whole current flows through the solar cell, leading to a zero-volt series resistance, the open circuit voltage is unaffected by its existence. Since shunt resistance offers an additional channel for the flow of light-generated current, lower levels of it may cause power losses in the solar cell. This re-routing reduces the electrical characteristics of the solar cell by making it more difficult for electric charges to pass across the junction.

Figure 26:
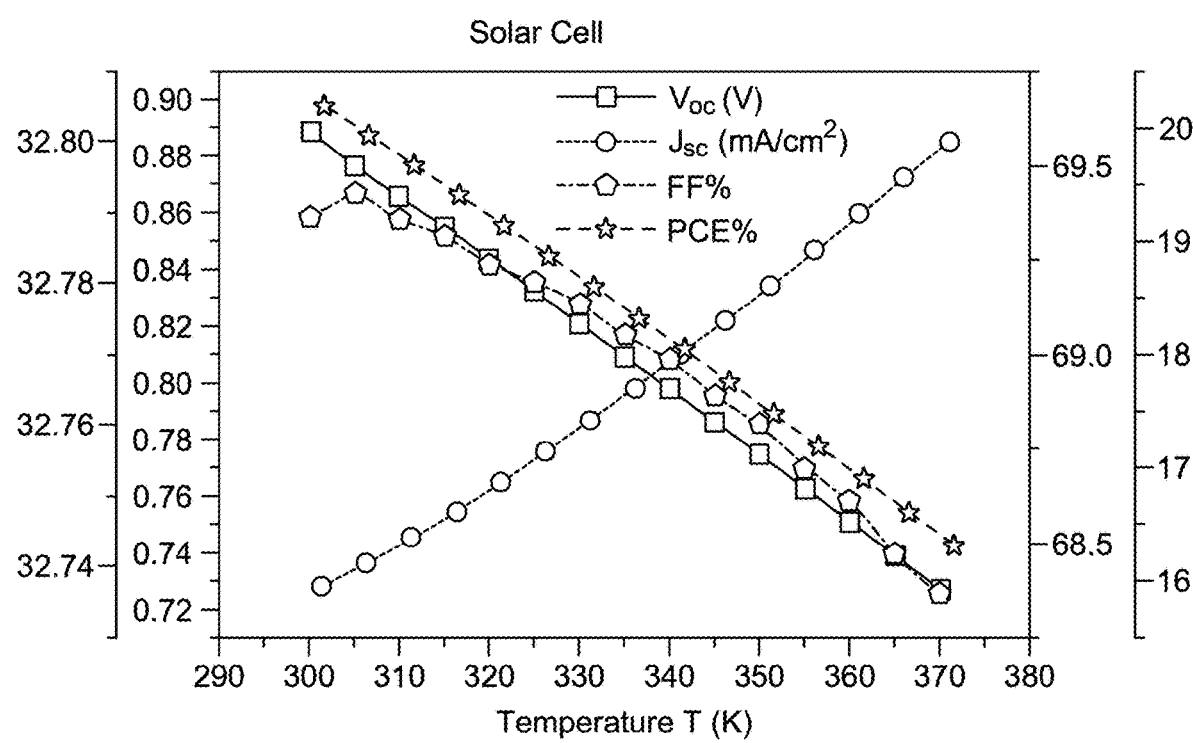
FIG. 26 is a plot showing the impact of temperature on the electrical characteristics of a proposed solar cell, according to certain embodiments.

FIG. 26 is a plot showing the impact of temperature on the electrical characteristics of a proposed solar cell. It shows the results of testing the device's performance at higher temperatures between 300 and 370 K. This temperature range was chosen to emphasize how different electrical properties vary worldwide. The system had a certain trend wherein the FF and $J_{sc}$ of the device increased at first but then began to drop after a certain amount. The fill factor reached its peak at 87% when the temperature was 305 K, while the $J_{sc}$ reached its maximum value of 32.8 mA/cm$^2$ at a temperature of 370 K. The device's efficiency decreased from 20.2% to 16.5% within the specified temperature range. In addition, the $V_{oc}$ was reduced from 0.89 to 0.73 V. The rise in $J_{sc}$ and FF may be attributed to the generating of more charge carrier density due to improved photon absorption in the absorber materials. The system exhibits optimal performance within this temperature range.

To conclude, persistent advancements and increasing advancements in PSCs and other PV applications necessitate persistent endeavors to investigate appropriate and efficacious materials. An extensive and meticulous analysis was conducted, refining the Perovskite solar cell through adjustments in its composition, including an ITO-C$_{60}$-MASnI$_3$—RbGeI$_3$—Cu$_2$O—Au tandem configuration, with the aim of improving its $J_{sc}$ and power conversion efficiency. The utilization of SCAPS-1D simulation software is used to achieved the optimal performance of this device. The front-contact layer of the device utilizes ITO, while the ETL layer is a thickness of 0.030 µm. The light absorber layers consist of MASnI$_3$ and RbGeI$_3$, which are a thickness of 0.4 microns. The HTL layer of Cu$_2$O has thickness of 0.12 µm. Extensive simulations and analyses of the solar cells' electrical properties were run to investigate their enhanced design and performance, with parameters such as thickness, defects, interface defect densities, shallow carrier densities, and temperature being varied. The device's $J_{sc}$ is simulated to be 19 mA/cm$^2$ at an open circuit voltage of 0.94 V. The PCE is 20.19%, and the fill factor value is enhanced to 65.49%. The device demonstrated its peak performance within the temperature range of 300 K to 370 K, exhibiting optimal response particularly between 300 K and 315 K.

These findings underscore the necessity for further and more comprehensive research in sustainable energy. Enhanced power conversion efficiency and improved electrical characteristics represent two potential advantages that the proposed solar cell design could offer to lead-free solar devices.

Numerous modifications and variations of the present disclosure are possible in light of the above teachings. Therefore, it is to be understood that within the scope of the appended claims, the disclosure may be practiced other than as specifically described herein.

The invention claimed is:

1. A lead-free solar cell module, comprising:
   a top protective layer,
   a middle photoactive layer,
   a bottom protective later, and
   a frame,
   wherein the middle photoactive layer comprises, in the following order:
   a back metal contact layer including gold (Au);
   a hole transport layer (HTL) including copper oxide ($Cu_2O$);
   an inorganic absorber layer including rubidium germanium iodide ($RbGeI_3$);
   a perovskite absorber layer including methylammonium tin iodide ($MASnI_3$);
   an electron transport layer (ETL) including fullerene ($C_{60}$); and
   a front contact layer including indium tin oxide (ITO);
   wherein the solar cell module achieves a current density ($J_{sc}$) of greater than or equal to 30 milliamperes per square centimeter ($mA/cm^2$) at an open-circuit voltage ($V_{OC}$) of 0.94 volts (V);
   wherein the top protective layer, middle photoactive layer and the bottom protective layer are secured in the frame,
   wherein the frame surrounds a periphery of the top protective layer, middle photoactive layer and the bottom protective layer, and
   wherein the ETL has a thickness of 0.03 µm, the perovskite absorber layer has a thickness of 0.4 µm, the inorganic absorber layer has a thickness of 0.4 µm, and the HTL has a thickness of 0.12 µm.

2. The lead-free solar cell module of claim 1, wherein the solar cell has a power conservation efficiency (PCE) greater than or equal to 15 percent (%) based on the total power used at conditions of 32.7 $mA/cm^2$ and a $V_{OC}$ of 0.94 V.

3. The lead-free solar cell module of claim 2, wherein the solar cell has a PCE greater than or equal to 17.5% based on the total power used at conditions of 32.7 $mA/cm^2$ and a $V_{OC}$ of 0.94 V.

4. The lead-free solar cell module of claim 3, wherein the solar cell has a PCE greater than or equal to 20% based on the total power used at conditions of 32.7 $mA/cm^2$ and a $V_{OC}$ of 0.94 V.

5. The lead-free solar cell module of claim 1, wherein the HTL has an energy bandgap in a range from 2.07 to 2.27 electron volts (eV) and the ETL has an energy bandgap in a range from 1.60 to 1.80 eV.

6. The lead-free solar cell module of claim 1, wherein the inorganic absorber layer has an energy bandgap in a range from 1.21 to 1.41 eV and the perovskite absorber layer has an energy bandgap in a range from 1.2 to 1.4 eV.

* * * * *